US012677392B2

(12) United States Patent
Beard et al.

(10) Patent No.: US 12,677,392 B2
(45) Date of Patent: Jul. 7, 2026

(54) AUTONOMOUS ENVIRONMENTAL MONITORING DEVICE

(71) Applicant: Dell Products L.P., Round Rock, TX (US)

(72) Inventors: Neal Beard, Austin, TX (US); Padmanabhan Narayanan, Chennai (IN); Vamshidhar Varre, Hyderabad (IN)

(73) Assignee: Dell Products L.P., Round Rock, TX (US)

( * ) Notice: Subject to any disclaimer, the term of this patent is extended or adjusted under 35 U.S.C. 154(b) by 471 days.

(21) Appl. No.: 18/227,912

(22) Filed: Jul. 29, 2023

(65) Prior Publication Data

US 2025/0040076 A1 Jan. 30, 2025

(51) Int. Cl.
*H05K 7/14* (2006.01)
*G01D 9/00* (2006.01)
G06F 1/26 (2006.01)
H04W 4/38 (2018.01)

(52) U.S. Cl.
CPC ........... *H05K 7/1498* (2013.01); *G01D 9/005* (2013.01); *G06F 1/263* (2013.01); *H04W 4/38* (2018.02)

(58) Field of Classification Search
USPC ....................................................... 702/130
See application file for complete search history.

(56) References Cited

U.S. PATENT DOCUMENTS

| | | | | |
|---|---|---|---|---|
| 11,348,439 B1 * | 5/2022 | Chandra | ................ | G01N 17/02 |
| 2007/0262863 A1 * | 11/2007 | Aritsuka | ................ | H04B 17/27 370/254 |
| 2016/0285922 A1 * | 9/2016 | Ramalingam | ....... | H04L 41/0806 |
| 2021/0135460 A1 * | 5/2021 | Zhai | ......................... | G06F 1/187 |
| 2023/0229225 A1 * | 7/2023 | Duncan | ............. | H02J 7/007192 713/320 |
| 2023/0362688 A1 * | 11/2023 | Cyrus | ..................... | H04W 4/38 |

* cited by examiner

*Primary Examiner* — Paul D Lee
(74) *Attorney, Agent, or Firm* — Joseph Mencher

(57) ABSTRACT

An autonomous environmental monitoring device includes a chassis that is configured to be housed in a computing device. The chassis includes a computing device connector that connects to the computing device and houses an autonomous environmental monitoring subsystem that is coupled to the computing device connector, at least one environmental monitoring sensor device, a battery system, and a storage device. The autonomous environmental monitoring subsystem provides at least one computing device operating function associated with the operation of the computing device when the computing device connector is connected to the computing device. The autonomous environmental monitoring subsystem also periodically retrieve respective environmental monitoring data generated by the at least one environmental monitoring sensor device when receiving power from the battery system, and stores the respective environmental monitoring data in the storage device.

20 Claims, 16 Drawing Sheets

506

AUTONOMOUS ENVIRONMENTAL MONITORING ENGINE DETERMINES TIME
506a

AUTONOMOUS ENVIRONMENTAL MONITORING ENGINE IDENTIFIES POWER INFORMATION
506b

AUTONOMOUS ENVIRONMENTAL MONITORING ENGINE ATTEMPTS TO READ COMPUTING DEVICE IDENTIFIER
506c

AUTONOMOUS ENVIRONMENTAL MONITORING ENGINE READS SENSOR DEVICES
506d

AUTONOMOUS ENVIRONMENTAL MONITORING DEVICE

BACKGROUND

The present disclosure relates generally to information handling systems, and more particularly to a device in an information handling system that monitors environmental factors autonomously.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switch devices, router devices, and/or other networking devices known in the art, are increasingly being deployed and/or stored in relatively challenging environments. For example, switch devices and/or their switch components may be deployed and/or stored in fresh air data centers in high humidity locations, cell towers in extreme cold or hot locations at the edge of networks, offsite storage locations with no climate control, and/or other locations where the environment creates the risk of the switch devices and/or its switch components being exposed to extreme environmental conditions, which raises several issues.

For example, the deployment and/or storage of switch devices and/or switch components in the challenging environments discussed above may have negative effects on the switch devices and/or their switch components that can lead to the unrecoverable failure of those switch devices and/or switch components in some situations (e.g., failures that may occur over a time period of weeks, months, or even years). For example, the operation or storage of switch devices and/or switch device components in such challenging environments can lead to dendritic growth on Ball Grid Array (BGA) surface-packaging used for integrated circuits, dendritic growth on solder joints, and/or other issues that can lead to premature component failure, loss of data, and/or impact to network uptime, which can result in repeated customer service dispatches for switch devices/switch components having the same failure characteristics and user dissatisfaction with the switch devices.

Furthermore, when failure of switch devices and/or switch components does occur due to such environmental conditions, it can be difficult to acquire historical data related to when the switch devices and/or switch components were placed into the challenging environments, how long the switch devices and/or switch components operated or were stored in the challenging environments, and/or other factors relating the storage and/or operation of the switch devices and/or switch components in the challenging environments. Some conventional switch devices utilize environmental monitoring systems that provide for the monitoring and collection of environmental monitoring data when the switch device is powered up and operating, but do not collect any environmental monitoring data when the switch device and its switch components are powered down and/or otherwise not operating, when environmental monitoring systems in the switch device have failed (e.g., due to an unavailable Basic Input/Output System (BIOS) or bootloader that prevents the capture of telemetry data or the use of thermal controls), and/or in other situations that would be apparent to one of skill in the art in possession of the present disclosure. The inventors of the present disclosure have recognized that any lack of collection of environmental monitoring data can impede the ability to perform root cause analysis of the failure of switch devices and/or their switch components, particularly in situations where users do not share information on the environmental conditions in which the switch devices and/or switch components are stored and/or operating.

Accordingly, it would be desirable to provide an environmental monitoring system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide an autonomous environmental monitoring engine that is configured to: provide, in response to a computing device connector that is coupled to the processing system being connected to a computing device, at least one computing device operating function associated with the operation of the computing device; periodically retrieve, when receiving power from a battery system that is coupled to the processing system, respective environmental monitoring data generated by at least one environmental monitoring sensor device that is coupled to the processing system; and store the environmental monitoring data in a storage device that is coupled to the processing system.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
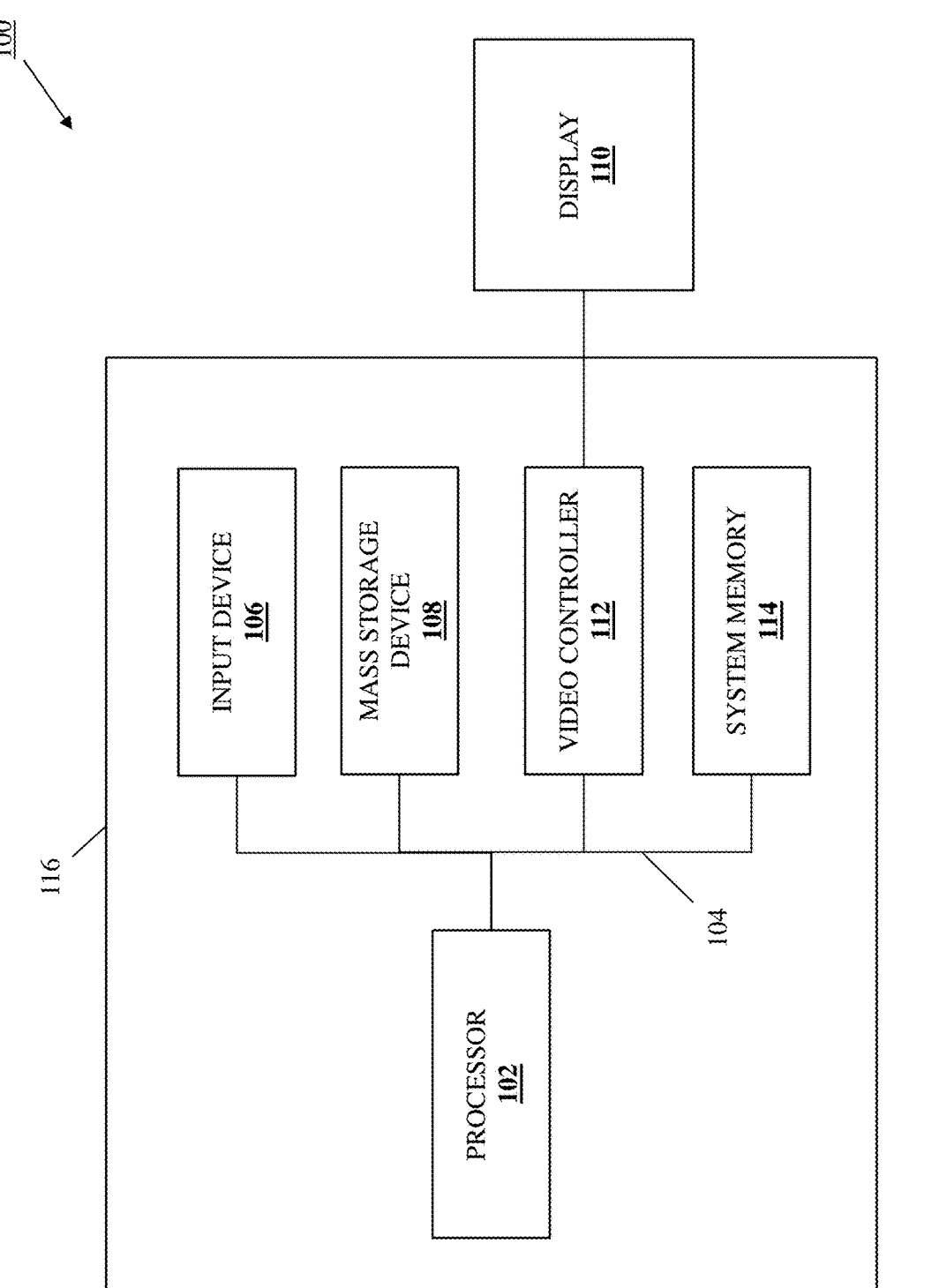
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
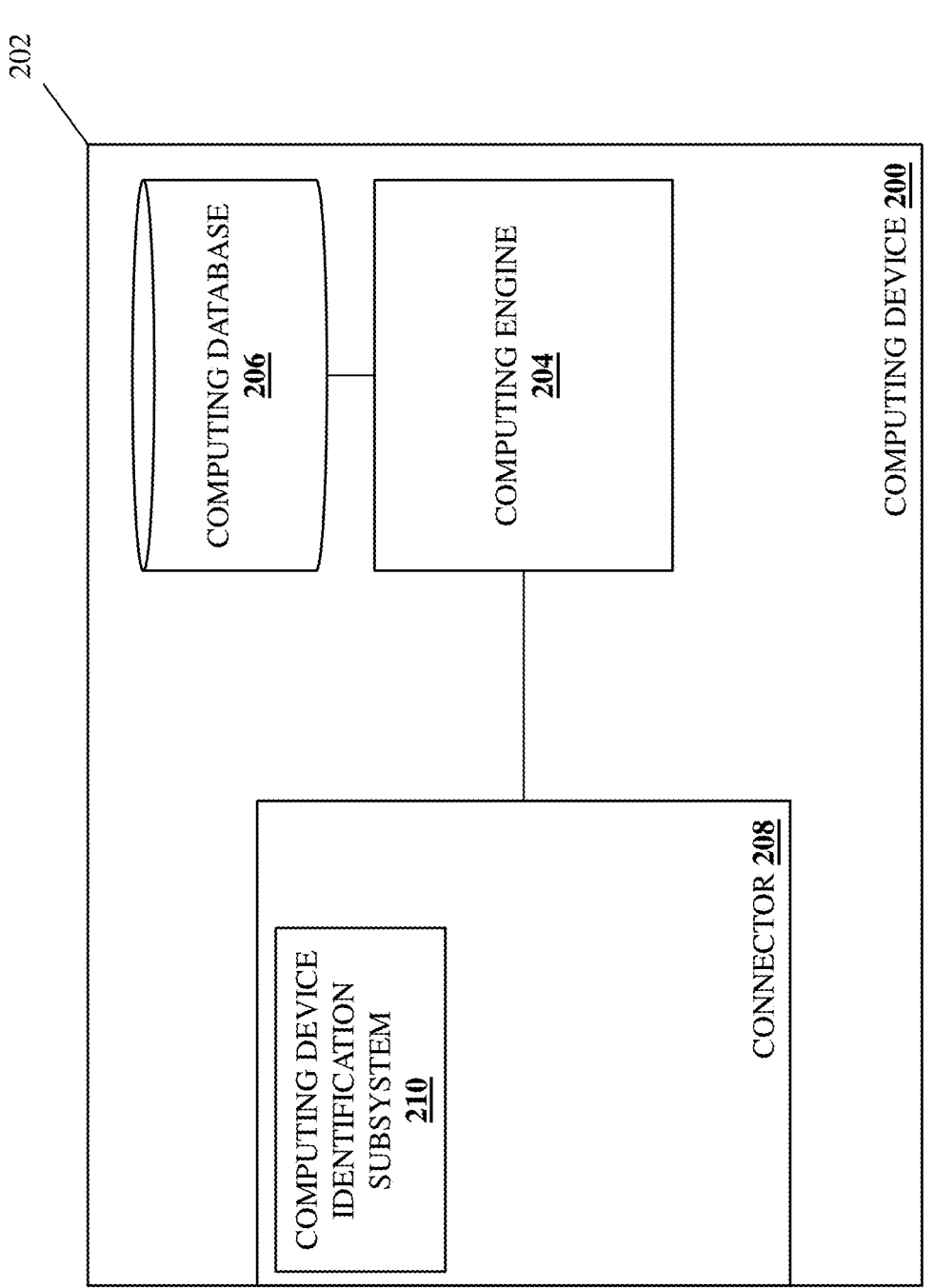
FIG. 2 is a schematic view illustrating an embodiment of a computing device that may be utilized with an autonomous environmental monitoring device provided according to the teachings of the present disclosure.

Referring now to FIG. 2, an embodiment of a computing device 200 is illustrated that may be utilized with the autonomous environmental monitoring device of the present disclosure. In an embodiment, the computing device 200 may be provided by the IHS 100 discussed above with reference to FIG. 1, and/or may include some or all of the components of the IHS 100, and in specific examples may be provided by a networking device such as a switch device. However, while illustrated and discussed as being provided by a switch device, one of skill in the art in possession of the present disclosure will recognize that functionality of the computing device 200 discussed below may be provided by a variety of other devices (e.g., server devices, storage systems, and/or other computing devices that would be apparent to one of skill in the art in possession of the present disclosure) that are configured to operate similarly as the computing device 200 illustrated and discussed below.

In the illustrated embodiment, the computing device 200 includes a chassis 202 that houses the components of the computing device 200, only some of which are illustrated and discussed below. For example, the chassis may house a processing system (not illustrated, but which may include the processor 102 discussed above with reference to FIG. 1 such as, for example, a Network Processing Unit (NPU), a Central Processing Unit (CPU), etc.) and a memory system (not illustrated, but which may include the memory 114 discussed above with reference to FIG. 1 such as, for example, Dynamic Random Access Memory (DRAM)) that is coupled to the processing system and that includes instructions that, when executed by the processing system, cause the processing system to provide a computing engine 204 that is configured to perform the functionality of the computing engines and/or computing devices discussed below.

In a specific example, the computing device 200 may include a Baseboard Management Controller (BMC) device (e.g., an integrated DELL® Remote Access Controller (iDRAC) available in computing devices provided by DELL® Inc. of Round Rock, Texas, United States) having a BMC processing system and a BMC memory system that includes instructions that, when executed by the BMC processing system, cause the BMC processing system to provide a BMC Operating System (BMC-OS) that includes the computing engine 204. In another specific example, the computing device 200 (e.g., a networking device such as a switch device in this example) may include a networking processing system (e.g., a Network Processing Unit (NPU) and a networking memory system that includes instructions that, when executed by the networking processing system, cause the networking processing system to provide a networking operating system (NOS) that includes the computing engine 204.

The chassis 202 may also house a storage system (not illustrated, but which may include the storage device 108 discussed above with reference to FIG. 1) that is coupled to the computing engine 204 (e.g., via a coupling between the storage system and the processing system) and that includes a computing database 206 that is configured to store any of the information utilized by the computing engine 204 discussed below. The chassis 202 may also include a connector 208 that is coupled to the computing engine 204 (e.g., via a coupling between the connector 208 and the processing system) and that may be configured to connect any of a variety of computing device components to the computing device 200.

In the illustrated embodiment, a computing device identification subsystem 210 is located on the connector 208 (e.g., attached to or embedded in the connector 208, for example, at the time of manufacture) and, as discussed below, may be configured to be read by a wireless reader device. For example, the computing device identification subsystem 210 may be provided by a Near Field Communication (NFC) tag that stores a "service tag" (e.g., a seven-byte service tag/identifier) or other identification number that one of skill in the art in possession of the present disclosure will appreciate provides a unique identifier for the computing device 200. However, one of skill in the art in possession of the present disclosure appreciate how the computing device identification subsystem 210 may be provided by other types of identification subsystems and/or may be provided in other locations in the chassis 202 of the computing device 200 while remaining within the scope of the present disclosure as well. Furthermore, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, and/or any of the functionality discussed below, while remaining within the scope of the present disclosure as well.

Figure 3:
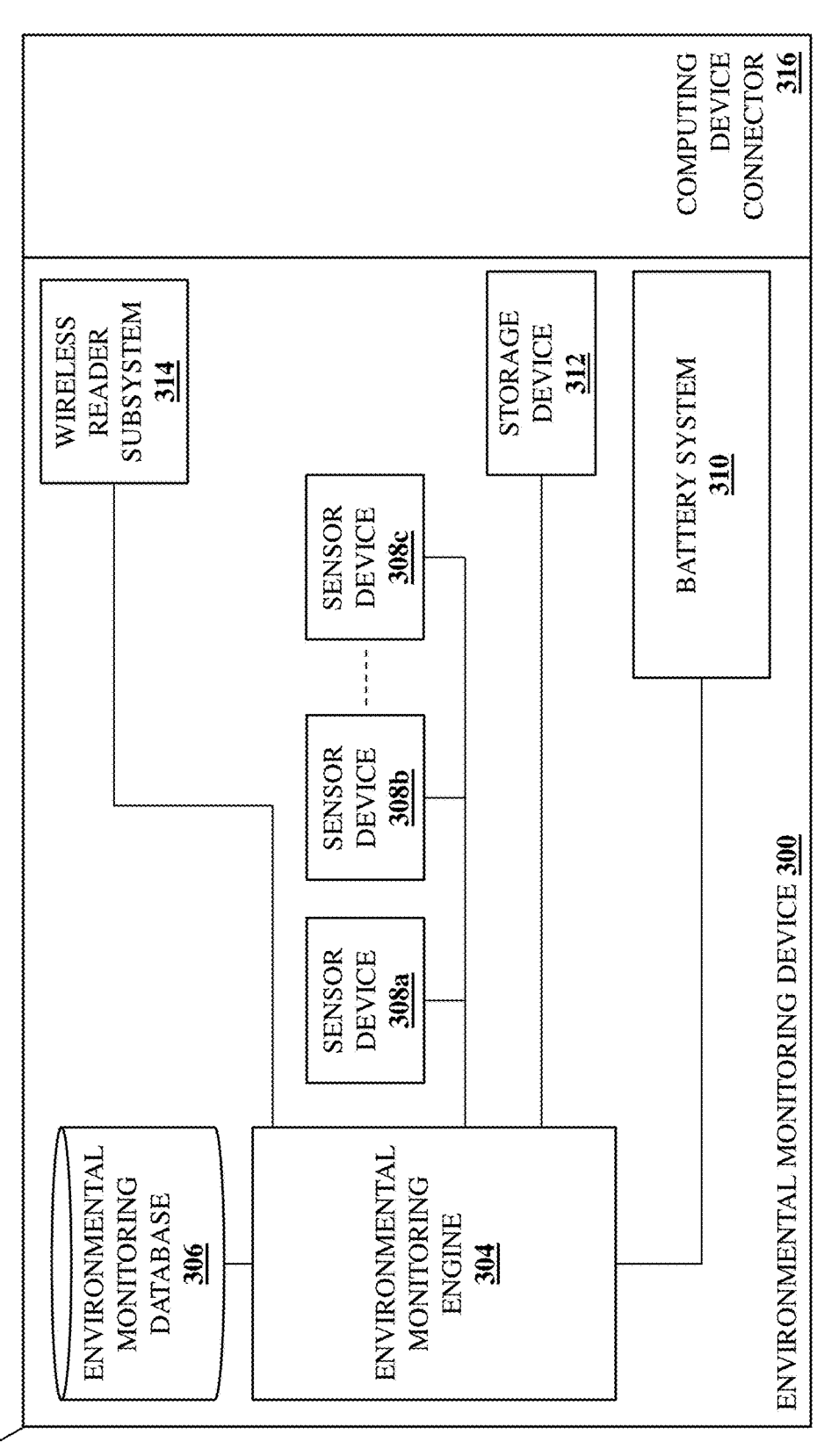
FIG. 3 is a schematic view illustrating an embodiment of an autonomous environmental monitoring device provided according to the teachings of the present disclosure.

Referring now to FIG. 3, an embodiment of an autonomous environmental monitoring device 300 is illustrated that may be provided according to the teachings of the present disclosure. In an embodiment, the autonomous environmental monitoring device 300 may be provided by any of a variety of components of the IHS 100 discussed above with reference to FIG. 1. However, while illustrated and discussed as being provided by computing device components, one of skill in the art in possession of the present disclosure will appreciate that the functionality of the autonomous environmental monitoring device 300 discussed below may be provided by any devices that are configured to operate similarly as the autonomous environmental monitoring device 300 discussed below.

In the illustrated embodiment, the autonomous environmental monitoring device 300 includes a chassis 302 that houses the components of the autonomous environmental monitoring device 300, only some of which are illustrated and discussed below. For example, the chassis 302 may house a processing system (not illustrated, but which may be similar to the processor 102 discussed above with reference to FIG. 1) and a memory system (not illustrated, but which may be similar to the memory 114 discussed above with reference to FIG. 1) that is coupled to the processing system and that includes instructions that, when executed by the processing system, cause the processing system to provide an autonomous environmental monitoring engine 304 that is configured to perform the functionality of environmental monitoring engines and/or environmental monitoring devices discussed below.

The chassis 302 may also house a storage system (not illustrated, but which may be similar to the storage device 108 discussed above with reference to FIG. 1) that is coupled to the autonomous environmental monitoring engine 304 (e.g., via a coupling between the storage system and the processing system) and that includes an environmental monitoring database 306 that is configured to store any of the information utilized by the autonomous environmental monitoring engine 304 discussed below. The chassis 302 may also house a plurality of sensor devices 308a, 308b and up to 308c that are coupled to the processing system and that are configured to generate data based on environmental factors (e.g., temperature data, humidity data, particulate matter data, and/or other environmental monitoring data that would be apparent to one of skill in the art in possession of the present disclosure). However, while specific examples of environmental monitoring data have been discussed, one of skill in the art in possession of the present disclosure will appreciate how other sensor devices that generate other types of environmental monitoring data may be included in the autonomous environmental monitoring device 300 while remaining within the scope of the present disclosure.

The chassis 302 may also house a battery system 310 that is coupled to the processing system (e.g., via a coupling between the battery system 310 and the processing system) and that is configured to provide power to the components of the autonomous environmental monitoring device 300 when the autonomous environmental monitoring device 300 is not coupled to a power system. The chassis 302 may also house a storage device 312 (which may be similar to the storage device 108 discussed above with reference to FIG. 1) that is coupled to the processing system (e.g., via a coupling between the storage device 312 and the processing system) that is configured to store data received by autonomous environmental monitoring engine 304. The chassis 302 may also house a wireless reader subsystem 314 that is coupled to processing system, and as discussed below may be configured to wirelessly read data from the computing device identification subsystem 210 in the computing device 200 discussed above with reference to FIG. 2.

The chassis 302 may also include a computing device connector 316 that is configured to connect the autonomous environmental monitoring device 300 to the computing device 200 of FIG. 2 (and/or similar computing devices). However, while a specific autonomous environmental monitoring device 300 has been illustrated and described, one of skill in the art in possession of the present disclosure will recognize that environmental monitoring devices (or other devices operating according to the teachings of the present disclosure in a manner similar to that described below for the autonomous environmental monitoring device 300) may include a variety of components and/or component configurations for providing the autonomous environmental monitoring functionality discussed below, while remaining within the scope of the present disclosure as well.

Figure 4A:
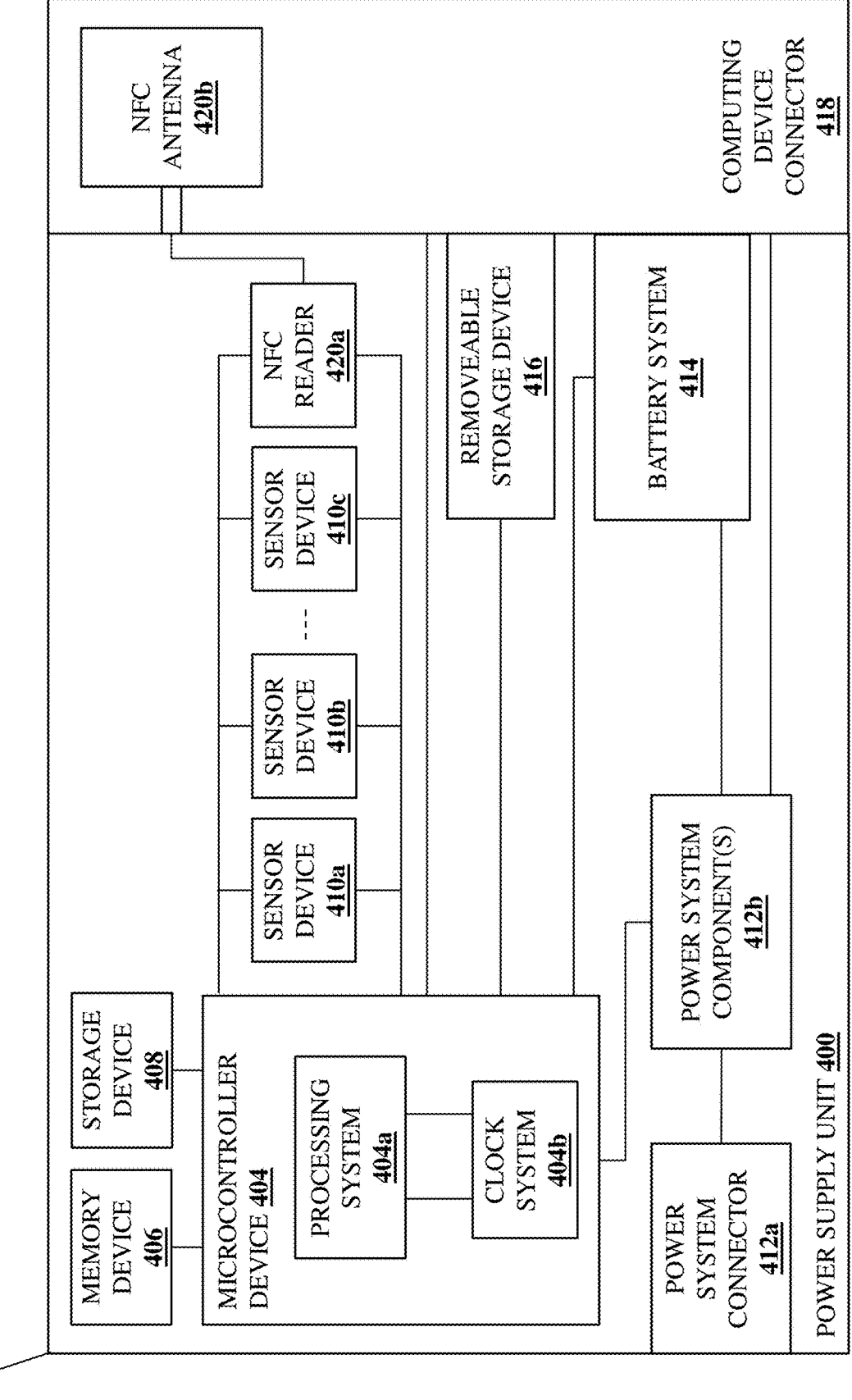
FIG. 4A is a schematic view illustrating an embodiment of a power supply unit that may provide the autonomous environmental monitoring device of FIG. 3.
Figure 4B:
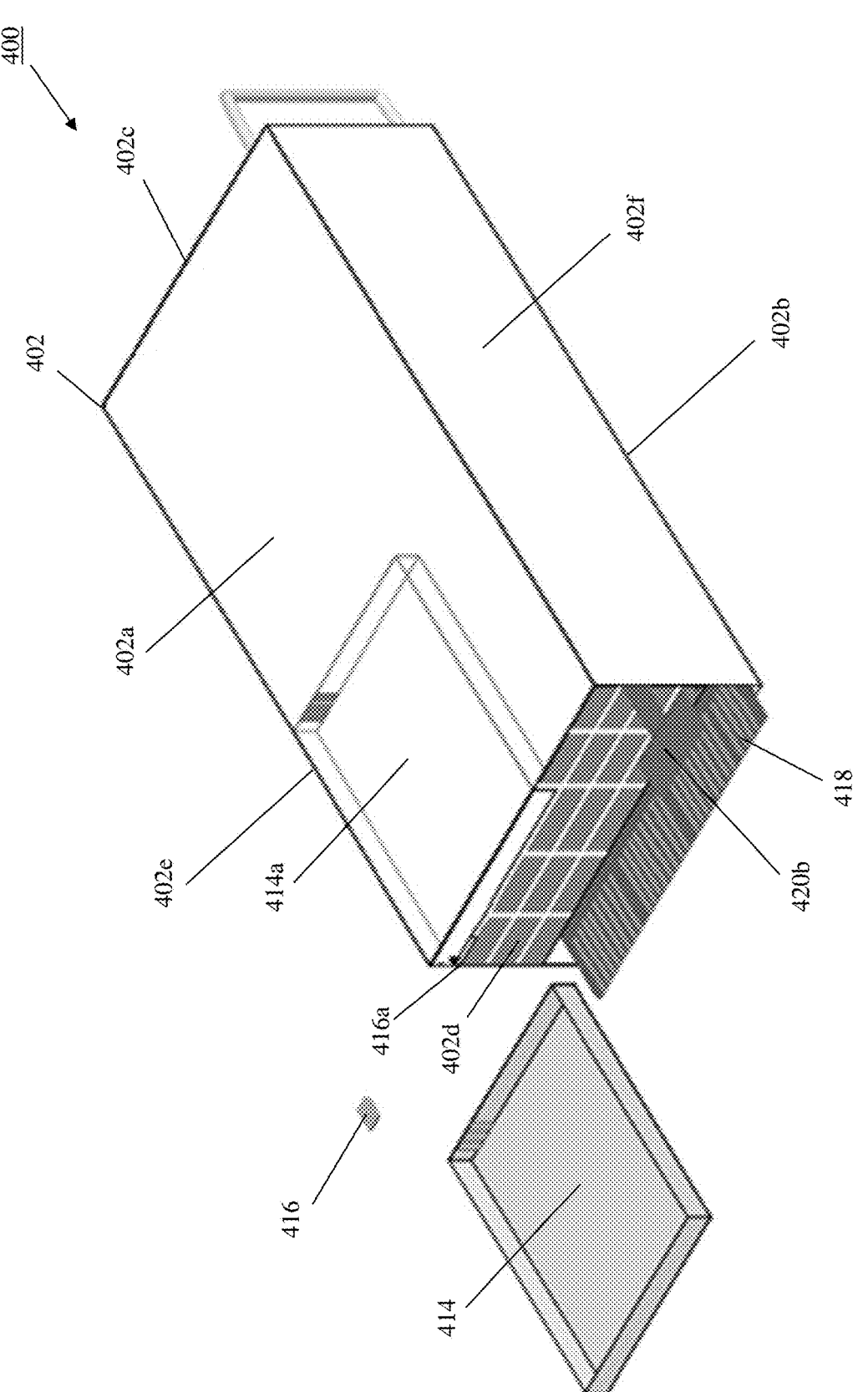
FIG. 4B is a perspective view illustrating an embodiment of the power supply unit of FIG. 4A.

For example, FIGS. 4A and 4B show a power supply unit 400 that, as will be appreciated by one of skill in the art in possession of the present disclosure, is a specific example of the autonomous environmental monitoring device 300 of FIG. 3. As will be appreciated by one of skill in the art in possession of the present disclosure, the power supply unit 400 may be configured to provide power to the IHS 100 discussed above with reference to FIG. 1. However, while illustrated and discussed as being provided by a power supply unit 400, one of skill in the art in possession of the present disclosure will appreciate that the functionality of the power supply unit 400 discussed below may be provided by a variety of other computing device components that are configured to operate similarly as the power supply unit 400 illustrated and discussed below.

With reference to FIGS. 4A and 4B, in the illustrated embodiment, the power supply unit 400 includes a chassis 402 that houses the components of the power supply unit 400, only some of which are illustrated and discussed below. As illustrated in FIG. 4B, the chassis 402 includes a top surface 402a, a bottom surface 402b that is located opposite the chassis 402 from the top surface 402a, a front surface 402c that extends between the top surface 402a and the bottom surface 402b, a rear surface 402d that is located opposite the chassis 402 from the front surface 402c and that extends between the top surface 402a and the bottom surface 402b, and a pair of side surfaces 402c and 402f that are located opposite one another on the chassis 402 and that each extend between the top surface 402a, the bottom surface 402b, the front surface 402c and the bottom surface 402d.

As can be seen in FIG. 4A, the chassis 402 may house a microcontroller device 404 that, in the illustrated example, includes a processing system 404a coupled to a clock system 404b (e.g., a Real-Time Clock (RTC) device) that is configured to track time for the processing system 404a when the processing system 404a is not connected to a power source, is operating in a low power mode, and/or in other processing system time tracking scenarios that would be apparent to one of skill in the art in possession of the present disclosure. The chassis 402 may also include a memory device 406 that is coupled to the microcontroller device 404, and one of skill in the art in possession of the present disclosure will recognize how the processing system 404a and the memory device 406 may provide the autonomous environmental monitoring engine 304 discussed above with reference to FIG. 3.

The chassis 402 may also include a storage device 408 (which may be similar to the storage device 108 discussed above with reference to FIG. 1) that is coupled to the microcontroller device 404 and that one of skill in the art in possession of the present disclosure will recognize may provide the environmental monitoring database 306 discussed above in FIG. 3. The chassis 402 may also include a plurality of sensor devices 410a, 410b and up to 410c that are coupled to the microcontroller device 404 (e.g., via an Inter-Integrated Circuit (I2C) connector, with the microcontroller device 404 acting as the I2C bus master) and that may provide the sensor devices 308a, 308b, and up to 308c discussed above in FIG. 3. As illustrated, the microcontroller device 404 may include data connections to the sensor devices 410a-410c that allow it to retrieve data from the sensor devices 410a-410c, and may also include power connections to the sensor devices 410a-410c that allow it to supply power to the sensor devices 410a-410c.

The chassis 402 may also include a power system connector 412a that is configured to connect the power supply unit 400 to a power source (not illustrated in FIGS. 4A and 4B). The chassis 402 may also house power system component(s) 412b (e.g., a rectifier, and integrated charger, and/or any other power system components that would be apparent to one of skill in the art in possession of the present disclosure) that are coupled to the power system connector 412a and the microcontroller device 404, and that are configured to receive power from the power system connector 412a and provide that power to the components of the power supply unit 400 and the computing device 200 of FIG. 2 when the power supply unit 400 is connected to the computing device 200. The chassis 402 may also house a battery system 414 (e.g., a rechargeable lithium-ion battery) that is coupled to the power system component(s) and the microcontroller device 404, and is configured to receive power from the power system components 412b when the power system connector 412a is connected to a power system, and provide power to the microcontroller device 404 and the components of the power supply unit 400 when the power supply unit 400 is not coupled to or receiving power from a power system. As can been seen in FIG. 4B, the chassis 402 defines a battery system housing 414a that is located adjacent its top surface 402a, rear surface 402d, and side surface 402e, and that is configured to house the battery system 414.

The chassis 402 may also house a removeable storage device 416 that is coupled to the microcontroller device 404 (e.g., via a Serial Peripheral Interface (SPI) connection) and that is configured to store any data received from the microcontroller device 404. In a specific example, the removeable storage device 416 may be provided by a micro Secure Digital (SD) card and, as will be appreciated by one of skill in the art in possession of the present disclosure, is a specific example of the storage device 312 discussed above in FIG. 3. As can been seen in FIG. 4B, the chassis 402 defines a removeable storage device housing 416a (e.g., a micro SD card slot) that is located adjacent its rear surface 402d, its side surface 402e, and the battery system housing 414a, and that is configured to house the removeable storage device 416. The chassis 402 may also include a computing device connector 418 that is coupled to the power system component(s) 412b and the microcontroller device 404 (e.g., via a Power Management Bus (PMBus) connection, with the microcontroller device 404 acting as a PMBus slave when the power supply unit 400 is connected to the computing device 200), and that is configured to connect the power supply unit 400 to the computing device 200 of FIG. 2, as well as transmit power received from a power source via the power system connector 412a and the power system components 412b to the computing device 200.

The chassis 402 may also house a Near Field Communication (NFC) reader 420a that is coupled to the microcontroller device 404 (e.g., via an I2C connection) and an NFC antenna 420b, with the NFC reader 420a configured to read data from the computing device identification subsystem 210 of FIG. 2 via the NFC antenna 420b and provide that data to the microcontroller device 404. In the specific example illustrated in FIG. 4B, the NFC antenna 420b may be provided on a strut (not visible in FIG. 4B) that is included on the chassis 402 and spaced apart from the computing device connector 418 such that, when the power supply unit 400 is connected to the computing device 200, the NFC antenna 420b will be positioned immediately adjacent the computing device identification subsystem 210 on the connector 208. As will be appreciated by one of skill in the art in possession of the present disclosure, the NFC reader 420a and the NFC antenna 420b provide a specific example of the wireless reader subsystem 314 of FIG. 3. However, while a specific power supply unit 400 that provides the autonomous environmental monitoring device of the present disclosure has been illustrated and described, one of skill in the art in possession of the present disclosure will recognize that a variety of other devices and/or computing device components may provide the autonomous environmental monitoring functionality discussed below while remaining within the scope of the present disclosure.

Figure 5A:
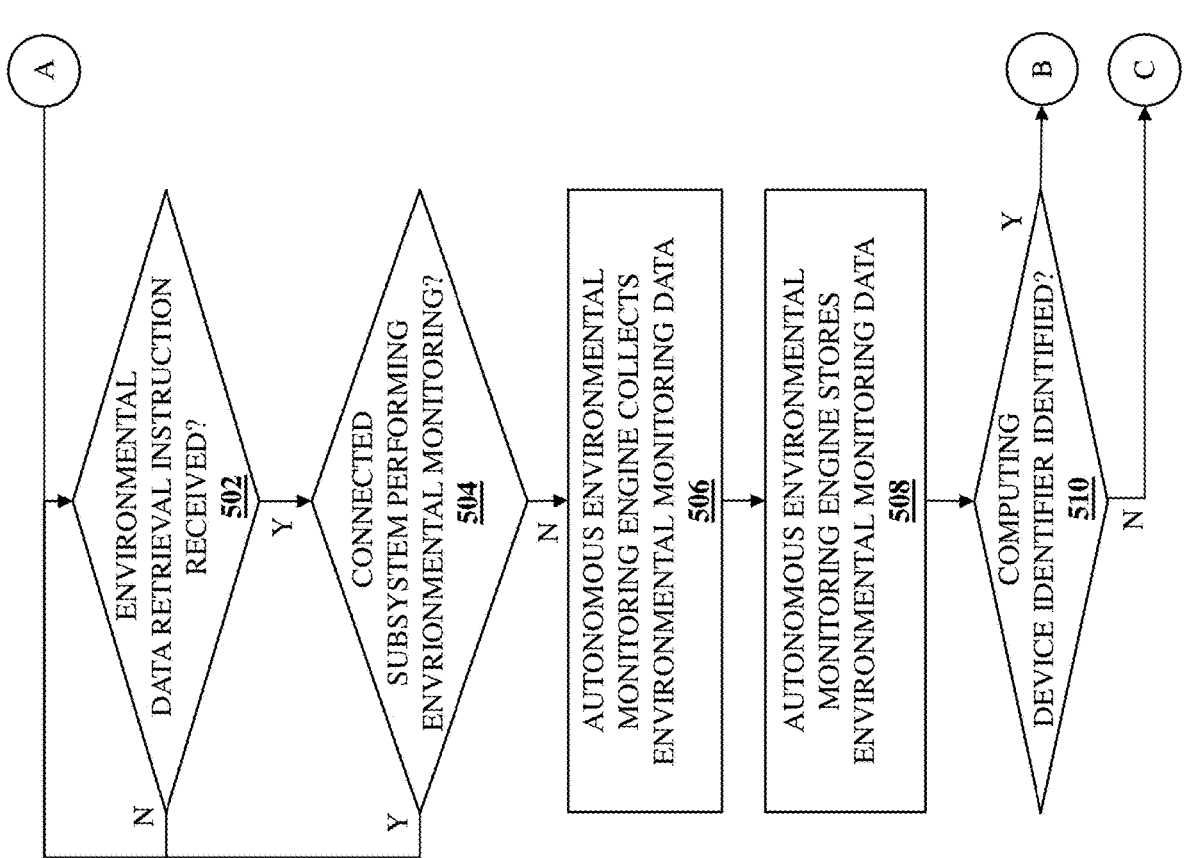
FIG. 5A is a flow chart illustrating an embodiment of a portion of a method for autonomously monitoring environmental factors.
Figure 5B:
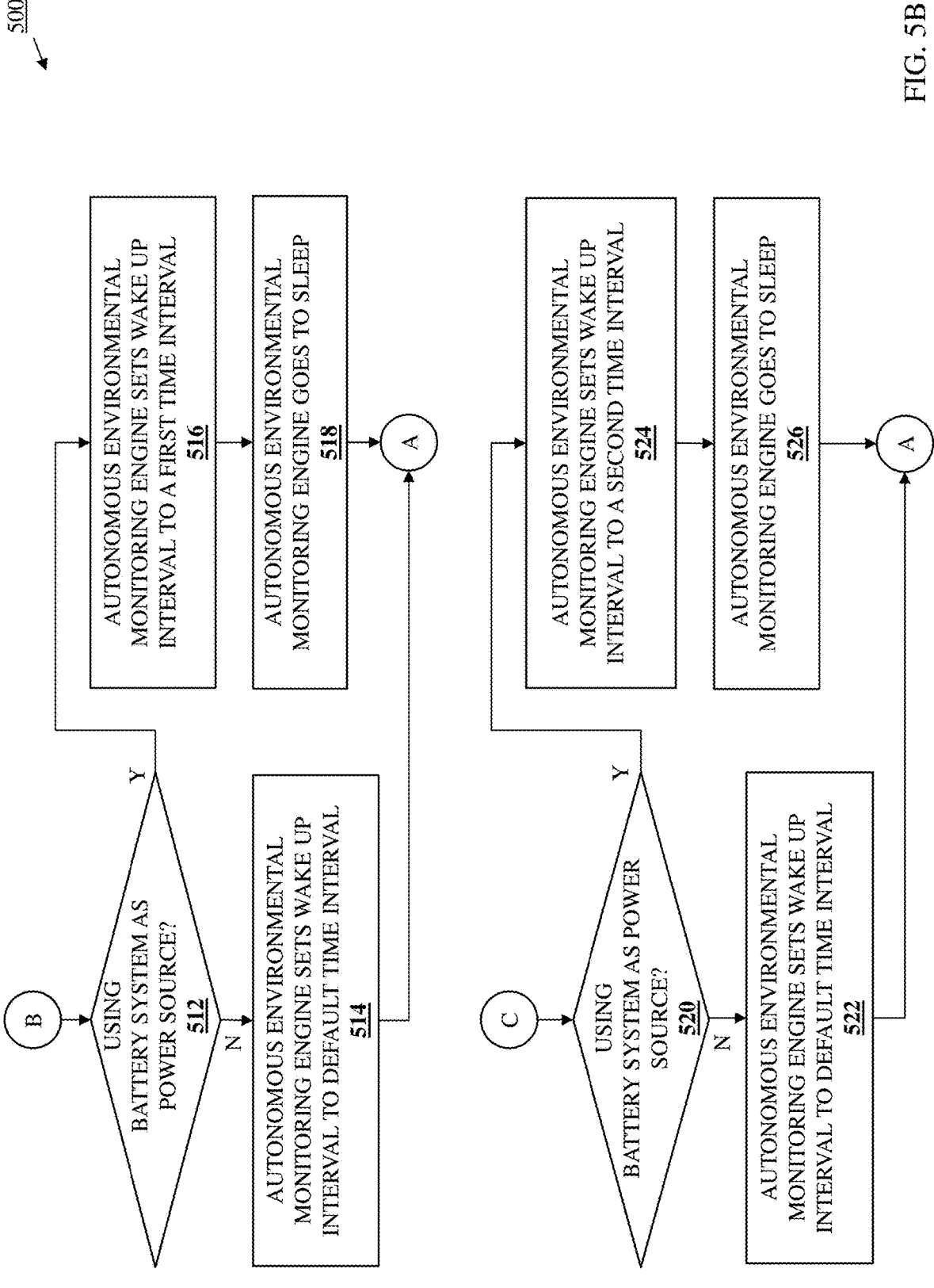
FIG. 5B is a flow chart illustrating an embodiment of a portion of a method for autonomously monitoring environmental factors.

Referring now to FIGS. 5A and 5B, an embodiment of a method 500 for autonomously monitoring environmental factors in a computing device is illustrated. As discussed below, the systems and methods of the present disclosure provide a computing device component that monitors and records environmental factors regardless of whether that computing device component is connected to a computing device and/or an external power source. For example, the autonomous environmental monitoring device of the present disclosure may include a chassis that is configured to be housed in a computing device. The chassis includes a computing device connector that connects to the computing device, and houses an autonomous environmental monitoring subsystem that is coupled to the computing device connector, at least one environmental monitoring sensor device, a battery system, and a storage device. The autonomous environmental monitoring subsystem provides at least one computing device operating function associated with the operation of the computing device when the computing device connector is connected to the computing device. The autonomous environmental monitoring subsystem also periodically retrieves respective environmental monitoring data generated by the at least one environmental monitoring sensor device when receiving power from the battery system, and stores the respective environmental monitoring data in the storage device. As such, environmental factors that can cause issues with computing devices and that are typically not captured in conventional environmental monitoring systems are recorded and available for failure analysis/root cause analysis.

In an embodiment, during or prior to the method 500, the autonomous environmental monitoring device 300 may be connected to the computing device 200 and, in response, the computing engine 204 may perform environmental monitoring data retrieval instruction programming operations in order to program the autonomous environmental monitoring device 300 to retrieve environmental monitoring data. In the specific examples discussed below, the power supply unit 400 of FIG. 4 is used to describe the operation of the autonomous environmental monitoring device of the present disclosure, but as discussed above the power supply unit 400 of FIG. 4 is just one embodiment of the autonomous environmental monitoring device 300 of FIG. 3, and a variety of other devices may be used to perform the autonomous environmental monitoring functionality of the present disclosure.

Figure 6:
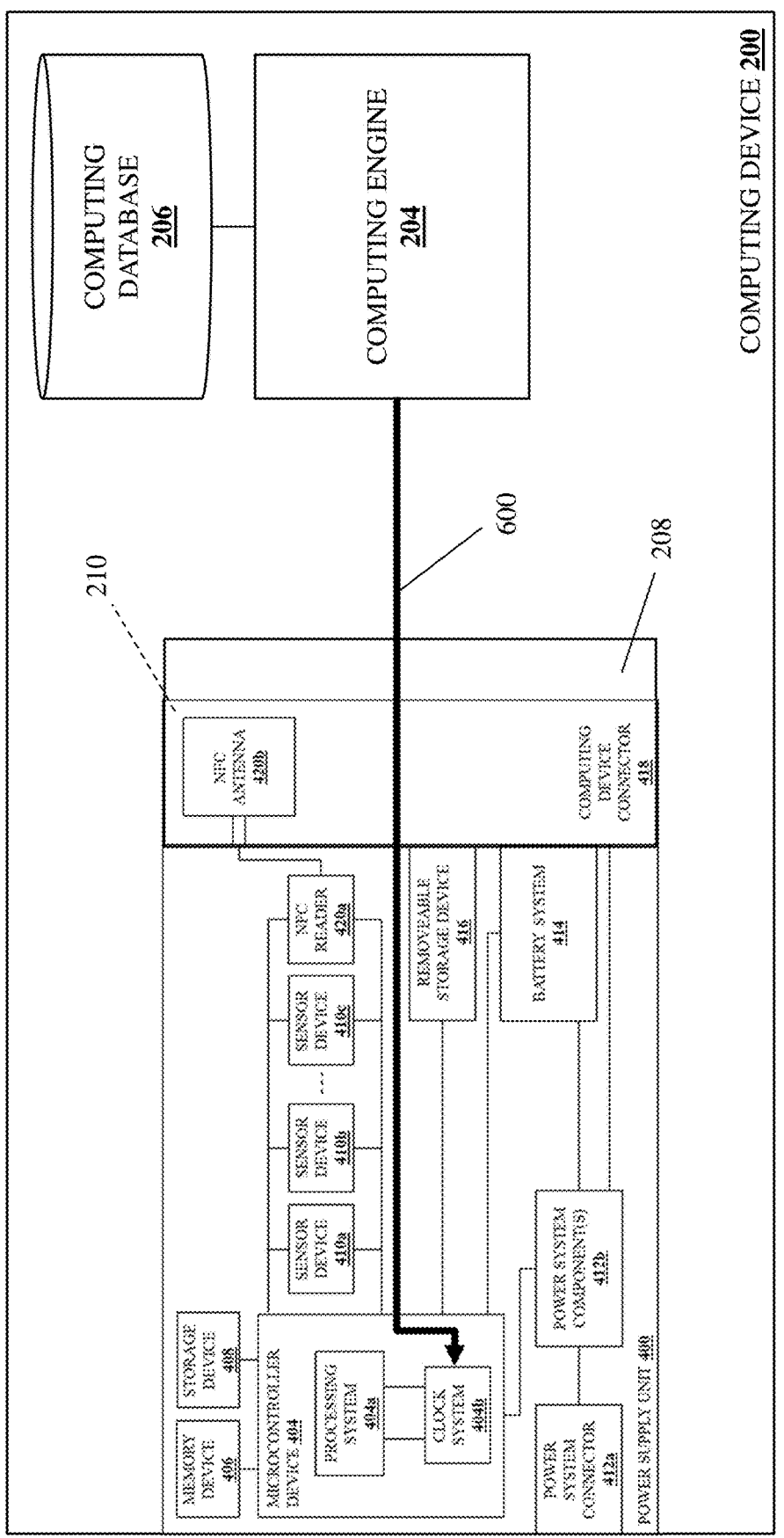
FIG. 6 is a schematic view illustrating an embodiment of the power supply unit of FIG. 4A connected to the computing device of FIG. 2 during the method of FIGS. 5A-5C.

With reference to FIG. 6, the power supply unit 400 may be connected to the computing device 200 by positioning the power supply unit 400 adjacent the computing device 200 such that the computing device connector 418 is aligned with the connector 208, and then moving the power supply unit 400 into the computing device 200 such that the computing device connector 418 on the power supply unit 400 engages the connector 208 on the computing device 200. As can be seen in FIG. 6, with the power supply unit 400 connected to the computing device 200 as discussed above, the NFC antenna 420*b* is positioned adjacent the computing device identification subsystem 210 on the connector 208 (e.g., with the NFC antenna 420*b* provided on the strut on the chassis 402 as discussed above positioned immediately adjacent the computing device identification subsystem 210 when the power supply unit 400 is connected to the computing device 200).

In an embodiment, in response to the power supply unit 400 being connected to the computing device 200, the computing engine 204 in the computing device 200 may perform environmental monitoring data retrieval instruction programming operations 600 that include programming the microcontroller device 404 to retrieve environmental monitoring data. For example, the environmental monitoring data retrieval instruction programming operations 600 may include programming the clock system 404*b* in the microcontroller device 404 to periodically provide environmental monitoring data retrieval instructions to the processing system 404*a*. In a specific example, the computing engine 204 may program the clock system 404*b* (e.g., using PMBus vendor specific commands) to provide interrupts, wake-up instructions, and/or other operations (e.g., on a periodic time interval that may be on the order of minutes, hours, days, etc.) that one of skill in the art in possession of the present disclosure would recognize are configured to instruct the processing system 404*a* to retrieve environmental monitoring data as described below.

In the examples described below, the initial programming of the clock system 404*b* provides for the provisioning of the environmental monitoring data retrieval instructions at a "default" time interval, and that default time interval may vary depending on any of a variety of factors that would be apparent to one of skill in the art in possession of the present disclosure. For example, the default time interval may be configured to allow for the environmental monitoring data collection operations described below via battery power from the battery system 414 for 4 months when the battery system begins with a 30% charge (e.g., a maximum amount of charge that the battery system 414 will be shipped with in some situations). However, while a specific example of the programming of environmental monitoring data retrieval instructions has been described, the microcontroller device 404 may be programmed to retrieve environmental monitoring data as discussed below in a variety of manners that would fall within the scope of the present disclosure.

Furthermore, during or prior to the method 500 and following the connection of the autonomous environmental monitoring device 300 to the computing device 200, the environmental monitoring engine 304 may perform an at least one computing device operating function associated with the operation of the computing device 200. For example, following the connection of the power supply unit 400 to the computing device 200, the power supply unit 400 may provide power from a power source to the computing device 200 and/or the components of the computing device 200 via the power system connector 412*a* and the power system component(s) 412*b*. However, while a specific example of a computing device operating function has been described, one of skill in the art in possession of the present disclosure will appreciate how other computing device operating functions may be provided for the computing device 200 while remaining within the scope of the present disclosure.

The method 500 begins at decision block 502 where it is determined whether an environmental monitoring data retrieval instruction is received. In an embodiment, at decision block 502, the environmental monitoring engine 304 in the environmental monitoring device 300 may monitor for an environmental monitoring data retrieval instruction. For example, at decision block 502, the processing system 404*a* included in the microcontroller device 404 of the power supply unit 400 may determine if an environmental monitoring data retrieval instruction has been received from the clock system 404*b*. As discussed above, when the power supply unit 400 is connected to the computing device 200, the computing engine 204 may program the clock system 404*b* to periodically provide interrupts, wake-up instructions, and/or other operations known in the art at a default time interval that are configured to instruct the processing system 404*a* to retrieve environmental monitoring data, and at decision block 502 the processing system 404*a* may monitor for those environmental monitoring data retrieval instructions from the clock system 404*b*. However, as discussed above, the processing system 404*a* in the microcontroller device 404 may monitor for other environmental monitoring data retrieval instructions at decision block 502 while remaining within the scope of the present disclosure. If, at decision block 502, it is determined that the environmental monitoring data retrieval instruction was not received, the method 500 returns to decision block 502. As such, the method 500 may loop such that the environmental monitoring engine 304/processing system 404*a* will continue to monitor for an environmental monitoring data retrieval instruction until it is received.

Figure 7A:
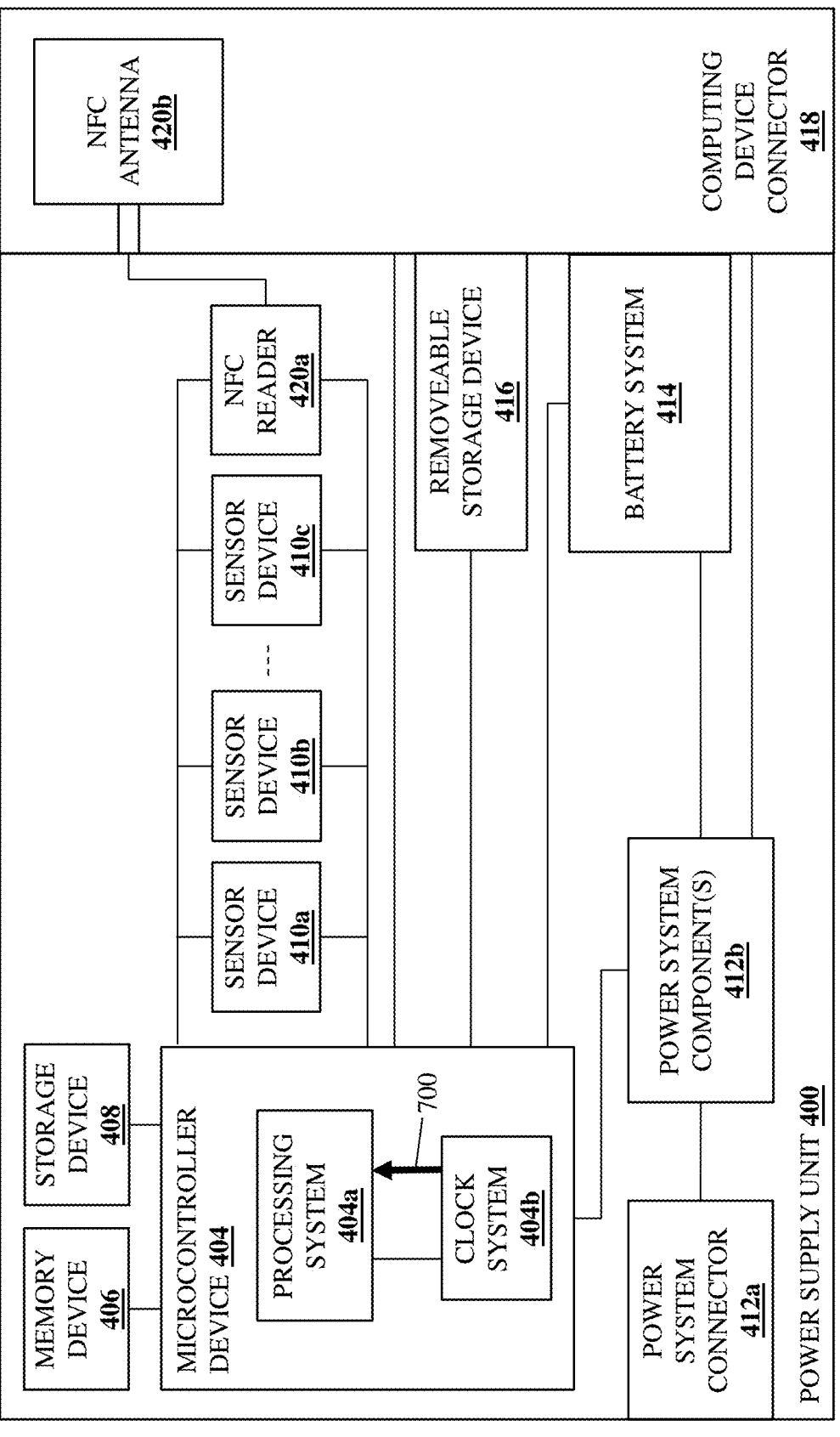
FIG. 7A is a schematic view illustrating an embodiment of the power supply unit of FIG. 4A operating during the method of FIGS. 5A-5C.

If, at decision block 502, it is determined that the environmental monitoring data retrieval instruction is received, the method 500 proceeds to decision block 504 where it is determined whether a connected subsystem is performing environmental monitoring. With reference to FIG. 7A, at decision block 502, the clock system 404*b* in the microcontroller device 404 of the power supply unit 400 may perform environmental monitoring data retrieval instruction provisioning operations 700 that may include transmitting an environmental monitoring data retrieval instruction (e.g., the interrupt or wake-up instruction discussed above), with the processing system 404*a* in the microcontroller device 404 receiving that environmental monitoring data retrieval instruction such that the method 500 proceeds to decision block 504.

Figure 7B:
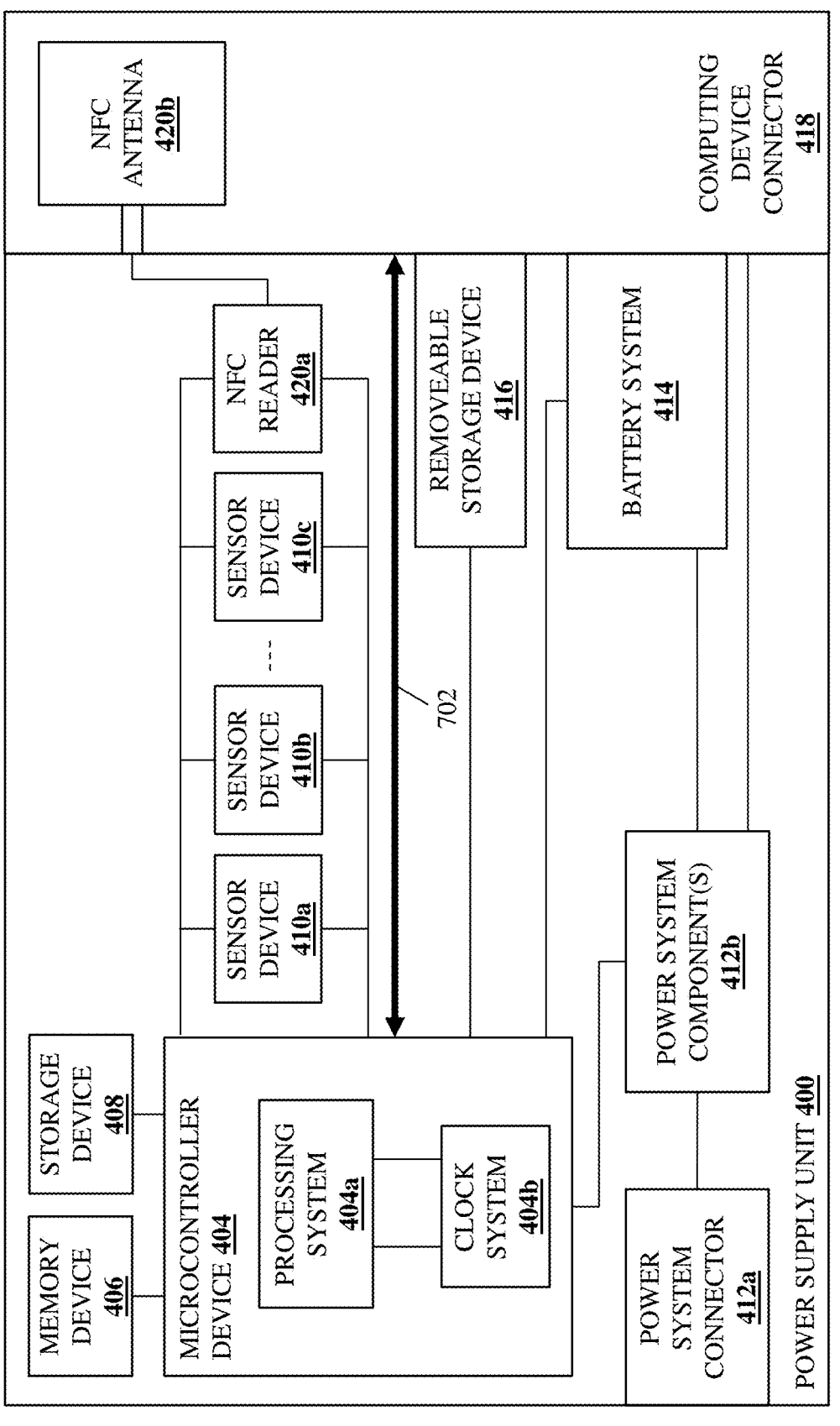
FIG. 7B is a schematic view illustrating an embodiment of the power supply unit of FIG. 4A operating during the method of FIGS. 5A-5C.

In an embodiment, at decision block 504 and in response to determining the environmental monitoring data retrieval instruction was received at decision block 502, the environmental monitoring engine 304 in the environmental monitoring device 300 may determine whether a connected subsystem is performing environmental monitoring. For example, with reference to FIG. 7B, in an embodiment of decision block 504 and in response to receiving the interrupt/wake-up instruction from the clock system 404*b* at decision block 502, the processing system 404*a* in the microcontroller device 404 may perform connected subsystem environmental monitoring determination operations 702 that include determining whether a connected subsystem is performing environmental monitoring. In another example, connected subsystem(s) in the computing device 200 may be configured to notify the processing system 404*a* in the microcontroller device 404 (e.g., at a time interval that is half the default time interval described herein) when they are actively performing environmental monitoring.

As such, one of skill in the art in possession of the present disclosure will appreciate how, when the environmental monitoring device 300/power supply unit 400 is connected to the computing device 200, any of a variety of components in the computing device 200 (e.g., the BMC OS or NOS discussed above) may perform environmental monitoring, and those connected subsystems and/or that environmental monitoring may be detected at decision block 504 using any of a variety of techniques known in the art. However, while specific examples of the determination of whether a connected subsystem is performing environmental monitoring has been illustrated and described, one of skill in the art in possession of the present disclosure will appreciate how environmental monitoring by connected subsystem may be detected in other manners that will fall within the scope of the present disclosure.

If, at decision block 504, it is determined that a connected subsystem is performing environmental monitoring, the method 500 returns to decision block 502. As such, the method 500 may loop such that, when an environmental monitoring data retrieval instruction is received while a connected subsystem is performing environmental monitoring, the environmental monitoring engine 304/processing system 404*a* continues to monitor for a subsequent environmental monitoring data retrieval instruction.

If, at decision block 504, it is determined that a connected subsystem is not performing environmental monitoring, the method 500 proceeds to block 506 where the autonomous environmental monitoring engine collects environmental monitoring data. In an embodiment, at block 506 and in response to determining that an environmental monitoring data retrieval instruction has been received at decision block 502 and no connected subsystem is performing environmental monitoring at decision block 504, the environmental monitoring engine 304 in the environmental monitoring device 300 may begin collecting environmental monitoring data. For example, the environmental monitoring engine 304 may be configured to collect environmental monitoring data (i.e., when an environmental monitoring data retrieval instruction has been received and no connected subsystem is performing environmental monitoring) when the environmental monitoring device 300 is stored in an inventory (e.g., in a warehouse) and/or is not connected to a computing device, when the environmental monitoring device 300 is connected to a computing device that is not receiving power from a power source, when the environmental monitoring device 300 is in transit (e.g., any time prior to being deployed for operation), when the environmental monitoring device 300 is connected to a computing device that does not have environmental monitoring functionality, and/or in other scenarios that would be apparent to one of skill in the art in possession of the present disclosure. However, while specific examples of environmental monitoring data collection scenarios have been discussed, one of skill in the art in possession of the present disclosure will appreciate how environmental monitoring data may be collected in any of a variety of other scenarios while remaining within the scope of the present disclosure as well.

Figure 5C:
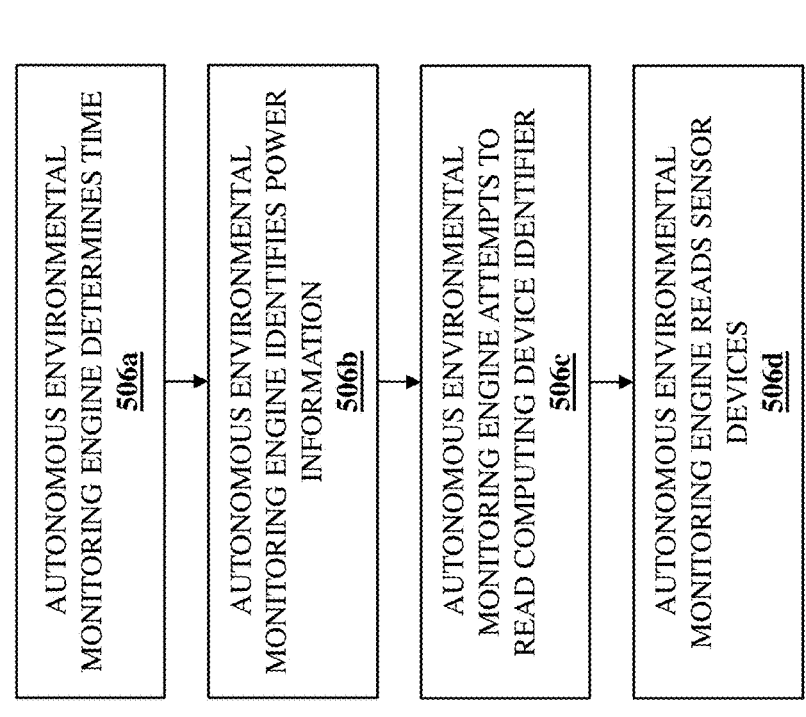
FIG. 5C is a flow chart illustrating an embodiment of a method block in the method for autonomously monitoring environmental factors of FIGS. 5A and 5B.
Figure 7C:
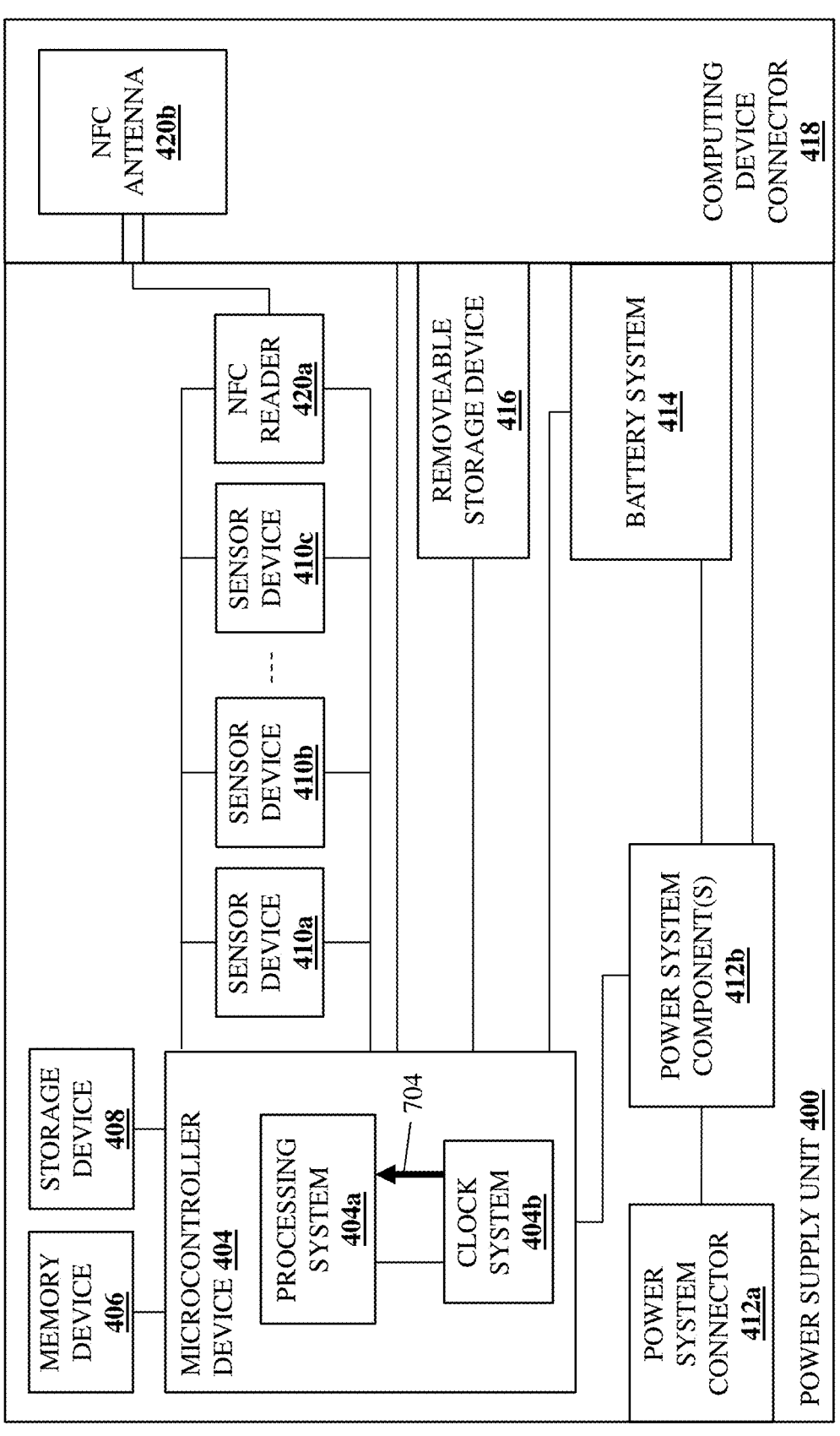
FIG. 7C is a schematic view illustrating an embodiment of the power supply unit of FIG. 4A operating during the method of FIGS. 5A-5C.

With reference to FIG. 5C, a specific example of block 506 is illustrated in which the autonomous environmental monitoring device 300 is provided by the power supply unit 400 that performs the environmental monitoring data collection of block 506 at sub-blocks 506*a*, 506*b*, 506*c*, and 506*d*. As such, the method block 506 may begin at sub-block 506*a* where the autonomous environmental monitoring engine determines a time. In an embodiment, at block 506*a*, the environmental monitoring engine 304 in the environment monitoring device 300 may determine a time that the environmental monitoring data is being collected. With reference to FIG. 7C, at block 506*a* and in the specific example utilizing the power supply unit 400, the processing system 404*a* in the microcontroller device 404 may perform time determination operations 704 that may include retrieving a current time from the clock system 404*b*. However, while a specific example of determining a time that environmental monitoring data is being collected has been described, one of skill in the art in possession of the present disclosure will appreciate how the time at which environmental monitoring data is collected may be determined in a variety of manners that will fall within the scope of the present disclosure as well.

Figure 7D:
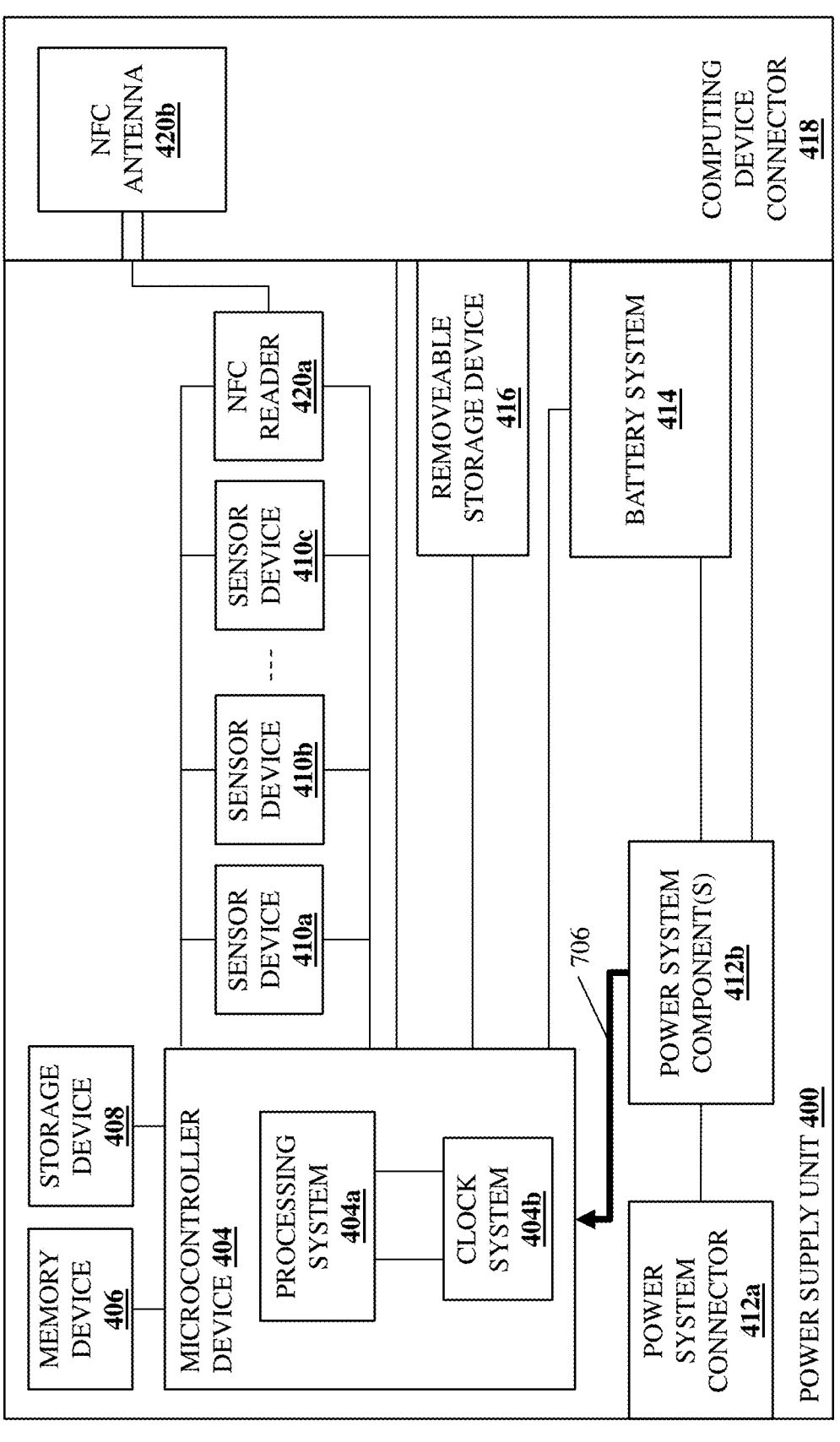
FIG. 7D is a schematic view illustrating an embodiment of the power supply unit of FIG. 4A operating during the method of FIGS. 5A-5C.

The method block 506 may then proceed to sub-block 506b where the autonomous environmental monitoring engine identifies power information. With reference to FIG. 7D, in an embodiment of block 506b and in the specific example utilizing the power supply unit 400, the microcontroller device 404 may perform power information identification operations 706 that include identifying any details about power being transmitted by the power supply unit 400. For example, the power information identification operations 706 may include determining an amount of power received by the power supply unit 400 (e.g., an input power received by the power system component(s) 412b from the power source via the power system connector 412a), and amount of power provided by the power supply unit 400 to the computing device 200 (e.g., an output power provided by the power system component(s) 412b via the computing device connector 418 to satisfy an active load of the computing device 200), and/or any other power information that would be apparent to one of skill in the art in possession of the present disclosure. However, while specific examples of power information have been described, one of skill in the art in possession of the present disclosure in the art in possession of the present disclosure will appreciate how other types of power information may be identified at sub-block 506b while remaining within the scope of the present disclosure.

Figure 7E:
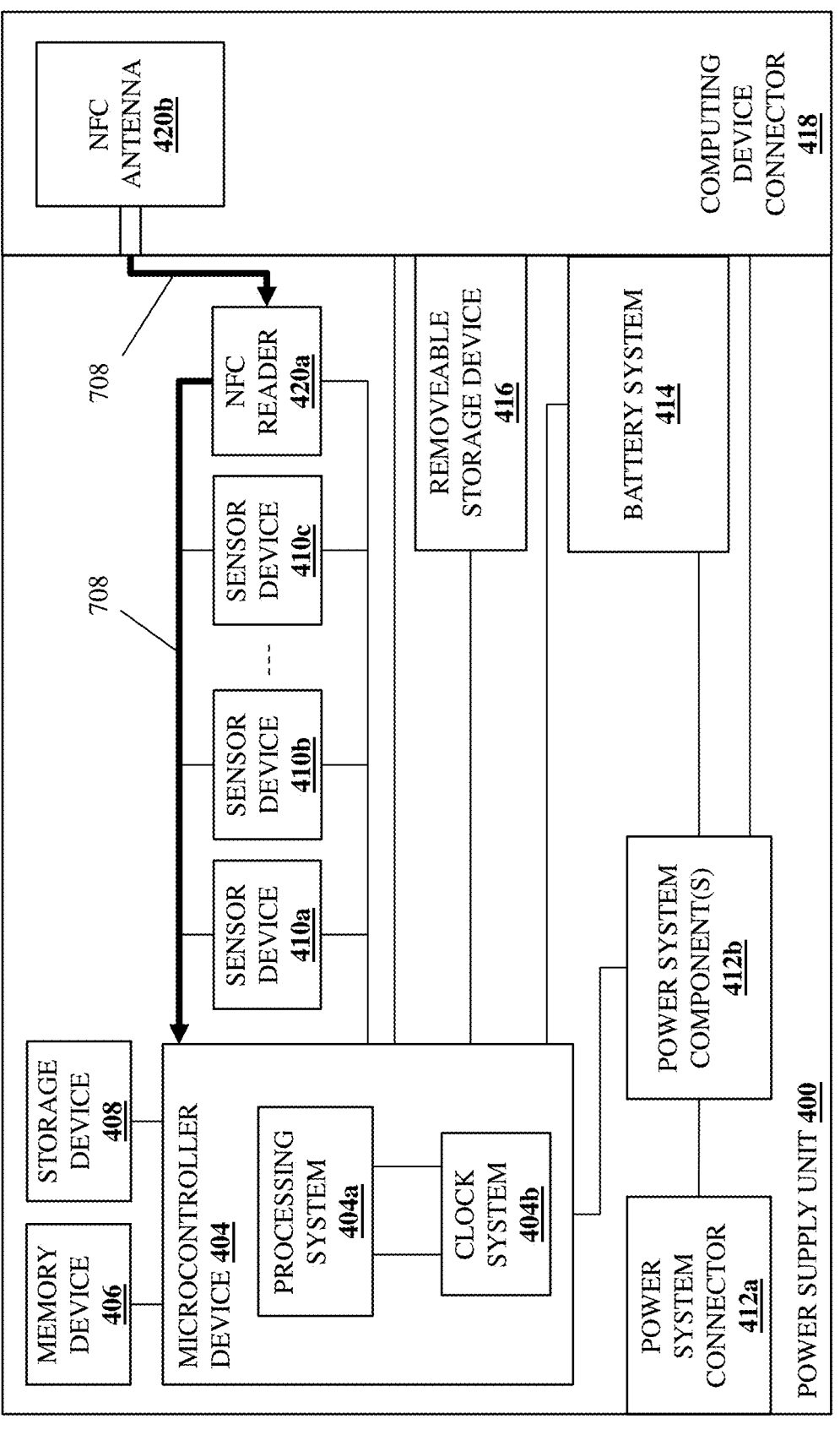
FIG. 7E is a schematic view illustrating an embodiment of the power supply unit of FIG. 4A operating during the method of FIGS. 5A-5C.

The method block 506 may then proceed to sub-block 506c where the autonomous environmental monitoring engine attempts to read a computing device identifier. In an embodiment, at block 506c, the environmental monitoring engine 304 may use its wireless reader subsystem 314 to attempt to read a computing device identifier. With reference to FIG. 7E, at block 506c and in the specific example utilizing the power supply unit 400, the microcontroller device 404 may perform computing device identifier read operations 708 that may include providing power to the NFC Reader 420a and using the NFC reader 420a and the NFC antenna 420b to attempt to read an adjacent NFC tag, if present.

As discussed above, when the power supply unit 400 is connected to the computing device 200, the NFC antenna 420b is positioned adjacent the computing device identification subsystem 210 on the connector 208. As such, one of skill in the art in possession of the present disclosure will appreciate how the computing device identifier read operations 708 may read the computing device identifier on the computing device identification subsystem 210 when the power supply unit 400 is connected to the computing device 200. Similarly, one of skill in the art in possession of the present disclosure will appreciate how the computing device identifier read operations 708 may not read any computing device identifier when the power supply unit 400 is not connected to a computing device (or a computing device does not include a computing device identification subsystem). However, while a specific example of reading a computing device identifier has been described, one of skill in the art in possession of the present disclosure will appreciate how computing device identifiers may be read using other techniques while remaining within the scope of the present disclosure.

Figure 7F:
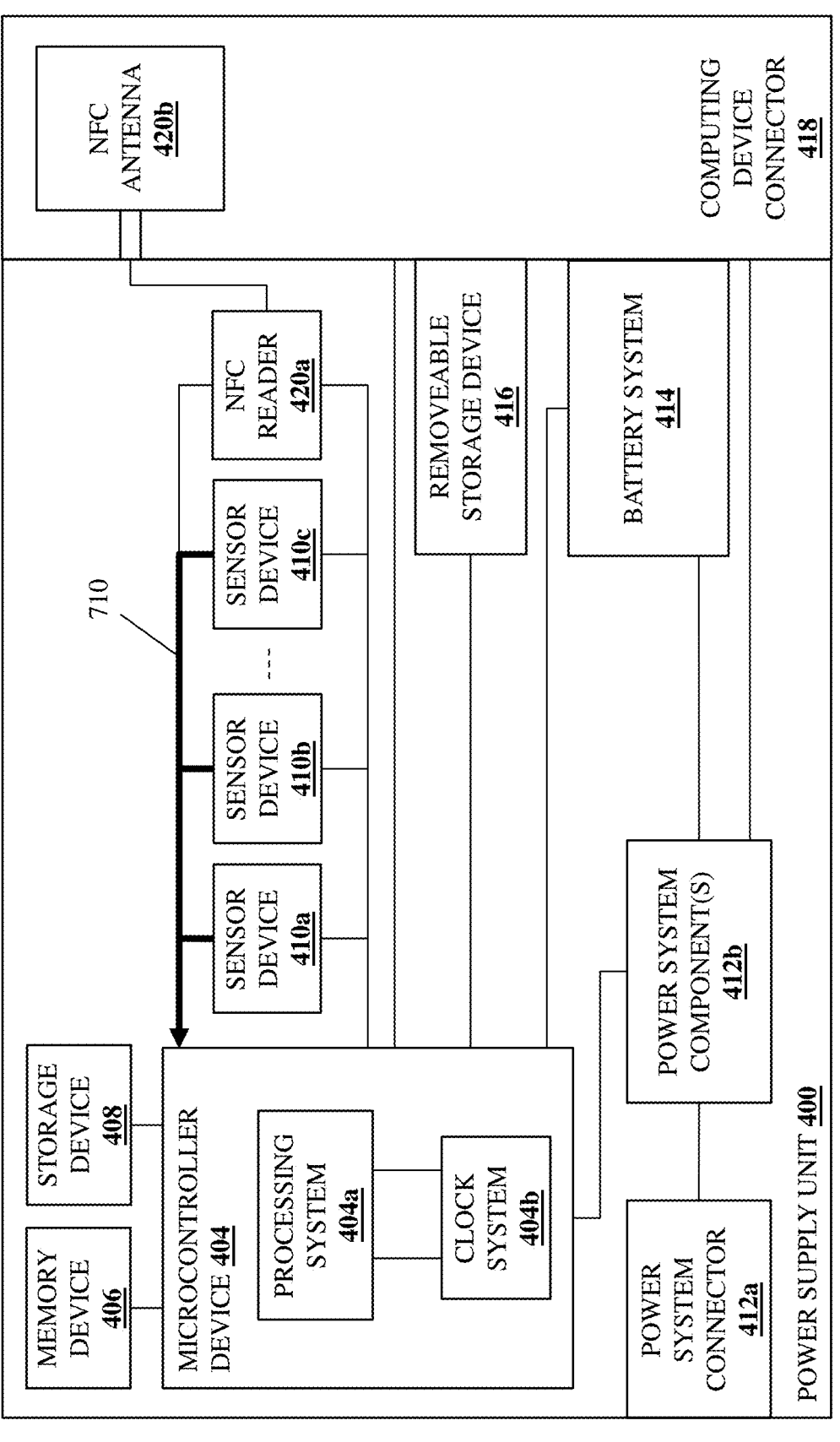
FIG. 7F is a schematic view illustrating an embodiment of the power supply unit of FIG. 4A operating during the method of FIGS. 5A-5C.

The method block 506 may then proceed to sub-block 506d where the autonomous environmental monitoring engine reads sensor devices. In an embodiment, at block 506d, the environmental monitoring engine 304 may read data from the sensor devices 308a, 308b, and up to 308c. With reference to FIG. 7F, at block 506d and in the specific example utilizing the power supply unit 400, the microcontroller device 404 may perform sensor read operations 710 that include reading environmental monitoring data from the sensor devices 410a, 410b, and up to 410c. For example, at sub-block 506d, the microcontroller device 404 may provide power to the sensor devices 410a, 410b, and up to 410c such that the sensor devices 410a-410c begin monitoring the environment and generating environmental monitoring data, and then read that environmental monitoring data generated by the sensor devices 410a-410c. As discussed above, the environmental monitoring data generated and read from the sensor devices 410a-410c at sub-block 506d may include temperature data, humidity data, particulate matter data, and/or other environmental monitoring data that would be apparent to one of skill in the art in possession of the present disclosure. However, while a specific example of reading environmental monitoring data has been described, one of skill in the art in possession of the present disclosure will appreciate how environmental monitoring data may be read using other techniques while remaining within the scope of the present disclosure.

Figure 7G:
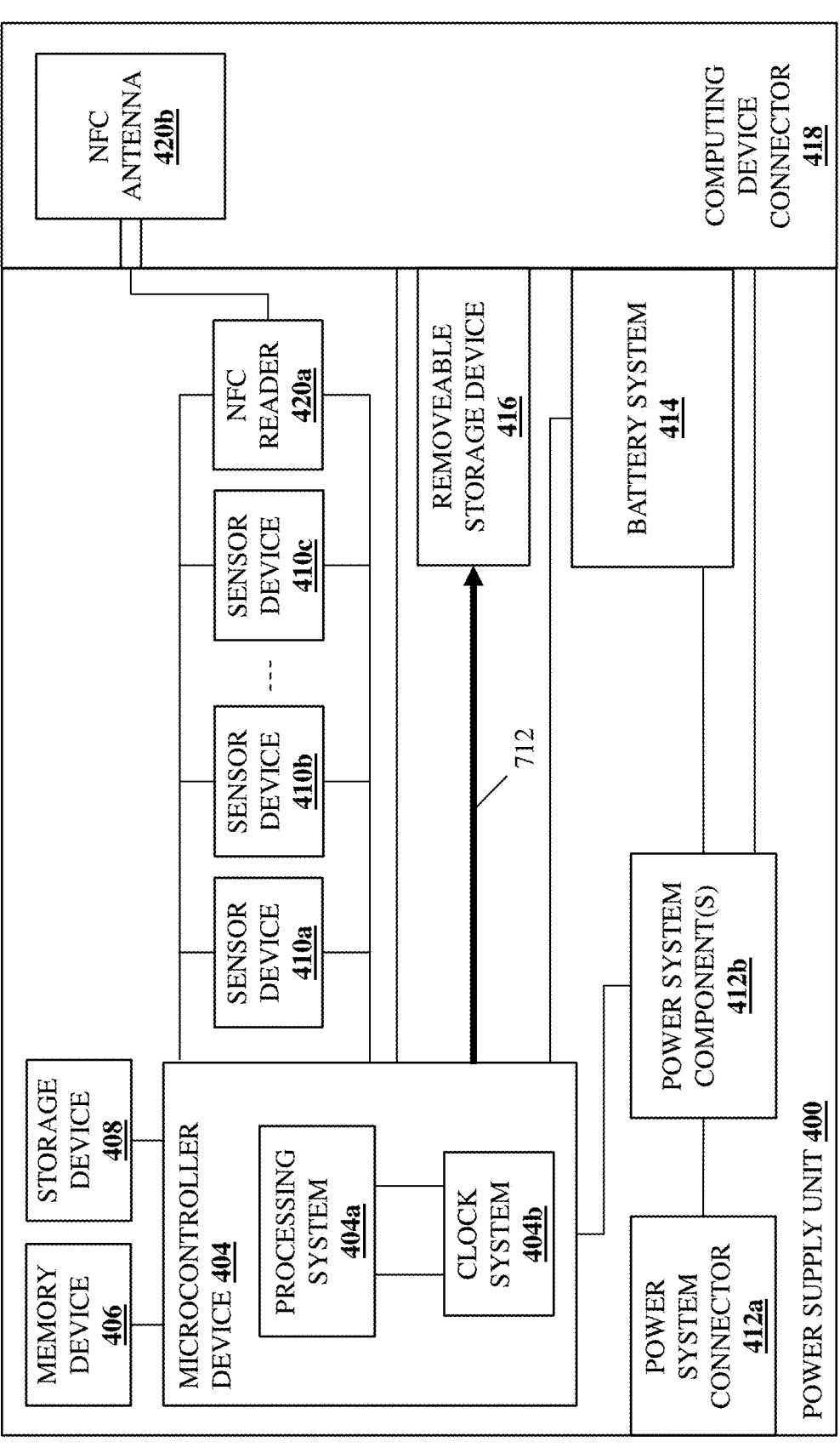
FIG. 7G is a schematic view illustrating an embodiment of the power supply unit of FIG. 4A operating during the method of FIGS. 5A-5C.

The method 500 then proceeds to block 508 where the autonomous environmental monitoring engine stores environmental monitoring data. In an embodiment, at block 508 and in response to the environmental monitoring engine 304 collecting the environmental monitoring data at block 506, the environmental monitoring engine 304 in the environmental monitoring device 300 may store that environmental monitoring data in the storage device 312. With reference to FIG. 7G, at block 508 and in the specific example utilizing the power supply unit 400, the processing system 404a in the microcontroller device 404 may perform environmental monitoring data storage operations 712 that may include storing the environmental monitoring data collected at block 506 and sub-blocks 506a-506d in the removable storage device 416. For example, at block 508, the processing system 404a may store the current time data retrieved from the clock system 404b at sub-block 506a, the power information identified at sub-block 506b, the results of the attempt to read the computing device identifier at sub-block 506c (e.g., a computing device identifier that was read, "unknown" if no computing device identifier was read, etc.), the sensor device data read at sub-block 506d, and/or any other environmental monitoring data that would be apparent to one of skill in the art in possession of the present disclosure, in the removable storage device 416.

In some embodiments, environmental monitoring data collected during some iterations of block 508 may not be stored. For example, in situations where the environmental monitoring data that is collected during a current iteration of block 508 has not changed relative to environmental monitoring data collected at a previous iteration of block 508, storage space in the removable storage device 416 may be conserved by not storing that unchanged environmental monitoring data. Furthermore, in situations in which collected environmental monitoring data is not changing, the wake-up interval for environmental monitoring data collection may be extended (e.g., similarly as described below by changing the default time interval to the first or second time interval). However, while specific examples of storing environmental monitoring data have been described, one of skill in the art will appreciate how a variety of environmental monitoring data may be stored using a variety of techniques while remaining within the scope of the present disclosure.

The method 500 then proceeds to decision block 510 where the method 500 proceeds depending on whether a computing device identifier was identified. As discussed above, in some embodiments, the environmental monitoring engine 304 in the environment monitoring device 300 may attempt to read the computing device identifier for the computing device 200 at block 506. However, in other embodiments, at decision block 510 the environmental monitoring engine 304 in the environmental monitoring device 300 may use the wireless reader subsystem 314 to attempt to read the computing device identifier from the computing device identification subsystem 210 included on the connector 208 in the computing device 200 similarly as described above. As such, at decision block 510, the environmental monitoring engine 304 in the environmental monitoring device 300 or the microcontroller device 404 in the power supply unit 400 will either have identified the computing device identifier, or will not have identified the computing device identifier.

If, at decision block 510, a computing device identifier was identified, the method 500 proceeds to decision block 512 where it is determined whether a battery system is being used as a power source. In an embodiment, at decision block 512, the environmental monitoring engine 304 in the environmental monitoring device 300 may determine if the battery system 310 is being used as a power source. For example, in the specific example utilizing the power supply unit 400, the processing system 404*a* in the microcontroller device 404 of the power supply unit 400 may determine whether the power supply unit 400 is operating on power received from a power source via the power system connector 412*a*, or operating on power from the battery system 414. In a specific example, the determination of whether the battery system 414 is being used as a power source may be made during the power information identification operations 706 performed by the microcontroller device 404 at sub-block 506*b*. However, while a specific example of determining whether a battery system is being used as a power source has been described, one of skill in the art in possession of the present disclosure will appreciate how other methods may be utilized to determine if a battery system is being used as a power source while remaining within the scope of the present disclosure.

If, at decision block 512, it is determined that a battery system is not being used as a power source, the method 500 proceeds to block 514 where the autonomous environmental monitoring engine sets a wake-up interval to a default time interval. In an embodiment, at block 514, the environmental monitoring engine 304 in the environmental monitoring device 300 may determine that the battery system 310 is not being used as a power source and, in response, may set the wake-up interval to the default time interval discussed above. In the specific example utilizing the power supply unit 400, at block 514 and in response to determining that the battery system 414 is being used as a power source at decision block 512, the processing system 404*a* in the microcontroller device 404 of the power supply unit 400 may set the wake-up interval for the processing system 404*a* to the default time interval discussed above.

As would be appreciated by one of skill in the art in possession of the present disclosure, entering block 514 of the method 500, the wake-up interval for the processing system 404*a* in the microcontroller device 404 of the power supply unit 400 may already be set to the default time interval, and thus at block 514 the "setting" of the wake-interval to the default time interval may simply include not changing that default time interval. However, described herein, in some embodiments the wake-up interval may be changed from the default time interval, and thus in those embodiments block 514 may provide for the setting of the wake-up interval back to the default time interval. However, while a specific example of setting a wake-up interval to a default time interval has been described, one of skill in the art in possession of the present disclosure will appreciate how the wake-up interval may be set in a variety of manners that will fall within the scope of the present disclosure. As such, if the environmental monitoring device 300/power supply unit 400 is connected to the computing device 200 such that the computing device identifier for the computing device 200 is identified, and the battery system 310/414 is not being used as a power source, then the wake-up interval will remain or be set at the default time interval.

If, at decision block 512, it is determined that the battery system is being used as a power source, the method 500 proceeds to block 516 where the autonomous environmental monitoring engine sets the wake-up interval to a first time interval. In an embodiment, at block 516 and in response to determining that the battery system 310 is being used as a power source, the environmental monitoring engine 304 in the environmental monitoring device 300 may set the wake-up interval for the environmental monitoring engine 304 to a first time interval. In the specific example utilizing the power supply unit 400, at block 516 and in response to determining that the battery system 414 is being used as a power source, the processing system 404*a* in the microcontroller device 404 of the power supply unit 400 may set the wake-up interval for the processing system 404*a* to a first time interval that is greater than the default time interval discussed above (e.g., extending the wake-up interval by days, weeks, months, or even years so that the battery system 414 may provide sufficient power to capture the details of the environmental conditions that may affect the operation of the computing device 200 and/or its components).

As would be appreciated by one of skill in the art in possession of the present disclosure, entering block 516 of the method 500, the wake-up interval for the processing system 404*a* in the microcontroller device 404 of the power supply unit 400 may already be set to the first time interval, and thus at block 516 the "setting" of the wake-interval to the first time interval may simply include not changing that first time interval. However, as described herein, in some embodiments the wake-up interval may be different from the first time interval (e.g., the wake-up interval may be the default time interval, or the second time interval discussed below), and thus in those embodiments block 516 may provide for the changing of the wake-up interval to the first time interval. Furthermore, while a specific example of setting a wake-up interval to a first time interval has been described, one of skill in the art in possession of the present disclosure will appreciate how the wake-up interval may be set in a variety of manners that will fall within the scope of the present disclosure. As such, if the environmental monitoring device 300/power supply unit 400 is connected to the computing device 200 such that the computing device identifier for the computing device 200 is identified, and the battery system 310/414 is being used as a power source, then the wake-up interval will remain or be set at the first time interval.

One of skill in the art in possession of the present disclosure will appreciate how the increasing of the wake-up interval from the default time interval to the first time interval will operate to conserve power in the battery system 310/414. As such, in the event the environmental monitoring device 300/power supply unit 400 is connected to a computing device 200 that is not receiving power, power in the battery system 310/414 may be conserved in order to allow the environmental monitoring of the present disclosure to be extended over a relatively longer time period.

In some embodiments, the first time interval may increase based on how long the environmental monitoring device 300/power supply unit 400 has been connected to a computing device 200 that is not receiving power. For example, when the environmental monitoring device 300 is connected to the computing device 200 that is not receiving power from a power source other than the battery system 310/414 and the method 500 loops (as discussed below) such that block 516 is performed multiple times, the environmental monitoring engine 304 in the environment monitoring device 300 may increase the first time interval at each performance (or after some number of performances) of block 516. In the specific example utilizing the power supply unit 400, as the method 500 loops and block 516 is performed repeatedly, the processing system 404a in the microcontroller device 404 of the power supply unit 400 may increase the first time interval to longer periods of time during each performance (or after some number of performances) of block 516, which one of skill in the art in possession of the present disclosure will appreciate operates to further preserve power in the battery system 310/414 in order to allow the environmental monitoring of the present disclosure to be performed when the computing device 200 is not connected to a power source for extended periods of time.

The method 500 then proceeds to block 518 where the autonomous environmental monitoring engine goes to sleep. In an embodiment, at block 518, the environmental monitoring engine 304 may enter a low power mode and/or otherwise go to "sleep". In the specific example utilizing the power supply unit 400, at block 518 the processing system 404a in the microcontroller device 404 of the power supply unit 400 may go to "sleep" by placing its power system component(s) 412b and/or other components into a no/low power mode that is configured to preserve the power in the battery system 414. Following block 514 or 518, the method 500 returns to decision block 502. As such, the method 500 may loop such that the environmental monitoring device 300/power supply unit 400 will wake up and collect environmental monitoring data when a connected subsystem is not doing so, and then set its wake-up interval based on its use of its battery system 310/414 while connected to the computing device 200.

If, at decision block 510, it is determined that a computing device identifier is not identified, the method proceeds to decision block 520 where it is determined whether the battery system is being used as a power source. In an embodiment, at decision block 520 and similarly as described above, the environmental monitoring engine 304 in the environmental monitoring device 300 may determine if the battery system 310 is being used as a power source. For example, in the specific example utilizing the power supply unit 400 and similarly as described above, the processing system 404a in the microcontroller device 404 of the power supply unit 400 may determine whether the power supply unit 400 is operating on power received from a power source via the power system connector 412a, or operating on power from the battery system 414. As discussed above, the determination of whether the battery system 414 is being used as a power source may be made during the power information identification operations 706 performed by the microcontroller device 404 at sub-block 506b. However, while a specific example of determining whether a battery system is being used as a power source has been described, one of skill in the art in possession of the present disclosure will appreciate how other methods may be utilized to determine if a battery system is being used as a power source while remaining within the scope of the present disclosure.

If, at decision block 520, it is determined that a battery system is not being used as a power source, the method 500 proceeds to block 522 where the autonomous environmental monitoring engine sets the wake-up interval to the default time interval. Similarly as described above, in an embodiment of block 522, the environmental monitoring engine 304 in the environmental monitoring device 300 may determine that the battery system 310 is not being used as a power source and, in response, may set the wake-up interval to the default time interval discussed above. In the specific example utilizing the power supply unit 400 and similarly as described above, at block 522 and in response to determining that the battery system 414 is not being used as a power source at decision block 520, the processing system 404a in the microcontroller device 404 of the power supply unit 400 may set the wake-up interval for the processing system 404a to the default time interval discussed above.

Similarly as discussed above, entering block 522 of the method 500, the wake-up interval for the processing system 404a in the microcontroller device 404 of the power supply unit 400 may already be set to the default time interval, and thus at block 522 the "setting" of the wake-up interval to the default time interval may simply include not changing that default time interval. However, described herein, in some embodiments the wake-up interval may be changed from the default time interval, and thus in those embodiments block 522 may provide for the setting of the wake-up interval back to the default time interval. However, while a specific example of setting a wake-up interval to a default time interval has been described, one of skill in the art in possession of the present disclosure will appreciate how the wake-up interval may be set in a variety of manners that will fall within the scope of the present disclosure. As such, if the environmental monitoring device 300/power supply unit 400 is not connected to the computing device 200 such that the computing device identifier for the computing device 200 is not identified (or is connected to a computing device with no computing device identification subsystem or an unreadable computing device identifier), and the battery system 310/414 is not being used as a power source, then the wake-up interval will remain or be set at the default time interval.

If, at decision block 520, it is determined that a battery system is being used as a power source, the method 500 proceeds to block 524 where the autonomous environmental monitoring engine sets the wake-up interval to a second time interval. In an embodiment, at block 524 and in response to determining that the battery system 310 is being used as a power source, the environmental monitoring engine 304 in the environmental monitoring device 300 may set the wake-up interval for the environmental monitoring engine 304 to a second time interval. In the specific example utilizing the power supply unit 400, at block 524 and in response to determining that the battery system 414 is being used as a power source, the processing system 404a in the microcontroller device 404 of the power supply unit 400 may set the wake-up interval for the processing system 404a to a second time interval that is greater than the first time interval discussed above (e.g., extending the wake-up interval by days, weeks, months, or even years so that the battery system 414 may provide sufficient power to capture the details of the environmental conditions that may affect the operation of the computing device 200 and/or its components).

As would be appreciated by one of skill in the art in possession of the present disclosure, entering block 524 of the method 500, the wake-up interval for the processing system 404*a* in the microcontroller device 404 of the power supply unit 400 may already be set to the second time interval, and thus at block 524 the "setting" of the wake-interval to the second time interval may simply include not changing that second time interval. However, as described herein, in some embodiments the wake-up interval may be different from the second time interval (e.g., the wake-up interval may be the default time interval, or the first time interval discussed above), and thus in those embodiments block 524 may provide for the changing of the wake-up interval to the second time interval. However, while a specific example of setting a wake-up interval to a second time interval has been described, one of skill in the art in possession of the present disclosure will appreciate how the wake-up interval may be set in a variety of manners that will fall within the scope of the present disclosure. As such, if the environmental monitoring device 300/power supply unit 400 is not connected to the computing device 200 such that the computing device identifier for the computing device 200 is not identified (or is connected to a computing device with no computing device identification subsystem or an unreadable computing device identifier), and the battery system 310/414 is being used as a power source, then the wake-up interval will remain or be set at the second time interval.

One of skill in the art in possession of the present disclosure will appreciate how the increasing of the wake-up interval from the default time interval or the first time interval to the second time interval will operate to conserve power in the battery system 310/414. As such, in the event the environmental monitoring device 300/power supply unit 400 is not connected to a computing device 200, power in the battery system 310/414 may be conserved in order to allow the environmental monitoring of the present disclosure to be extended over a relatively longer time period.

In some embodiments, the second time interval may increase based on how long the environmental monitoring device 300/power supply unit 400 has not been connected to a computing device 200. For example, when the environmental monitoring device 300 is not connected to the computing device 200 and the method 500 loops (as discussed below) such that block 524 is performed multiple times, the environmental monitoring engine 304 in the environment monitoring device 300 may increase the second time interval at each performance (or some number of performances) of block 524. In the specific example utilizing the power supply unit 400, as the method 500 loops and block 524 is performed repeatedly, the processing system 404*a* in the microcontroller device 404 of the power supply unit 400 may increase the second time interval to longer periods of time during each performance (or some number of performances) of block 524, which one of skill in the art in possession of the present disclosure will appreciate operates to further preserve power in the battery system 310/414 in order to allow the environmental monitoring of the present disclosure to be performed when the power supply unit 400 is not connected to the computing device 200 for extended periods of time.

The method 500 then proceeds to block 526 where the autonomous environmental monitoring engine goes to sleep. In an embodiment, at block 526 and similarly as described above, the environmental monitoring engine 304 may enter a low power mode and/or otherwise go to "sleep". In the specific example utilizing the power supply unit 400 and similarly as described above, at block 526 the processing system 404*a* in the microcontroller device 404 of the power supply unit 400 may go to "sleep" by placing its power system component(s) 412*b* and/or other components into a no/low power mode that is configured to preserve the power in the battery system 414. Following block 522 or 526, the method 500 returns to decision block 502. As such, the method 500 may loop such that the environmental monitoring device 300/power supply unit 400 will wake up and collect environmental monitoring data a computing device, and set its wake-up interval to extended time period(s) when not connected to the computing device 200.

As will be appreciated by one of skill in the art in possession of the present disclosure, the collection and storage of environmental monitoring data discussed above allows a network administrator or user to access the environmental monitoring data stored on the storage device 312 in the environmental monitoring device 300. For example, that environmental monitoring data may be accessed by a network administrator and/or user by retrieving the data directly from the storage device 312, returning the environmental monitoring device 300 to the vendor to have the data extracted and analyzed, and/or in the specific example utilizing the power supply unit 400, removing the removeable storage device 416 from the power supply unit 400 and returning it to the vendor to have the data extracted and analyzed. In the event of a failure or other issue with the computing device 200 and/or the power supply unit 400, the vendor, network administrator, and/or other user may use the retrieved environmental monitoring data to perform failure analysis and/or "root cause" analysis in order to determine the cause of the failure of the computing device 200, power supply unit 400, or other environmental monitoring device. However, while specific examples of accessing environmental monitoring data collected and stored in the environmental monitoring device/power supply unit of the present disclosure have been described, one of skill in the art in possession of the present disclosure will appreciate how other method of accessing environmental monitoring data collected and stored in the environmental monitoring device/power supply unit of the present disclosure will fall within the scope of the present disclosure as well.

In some embodiments, the power supply unit 400 or other environmental monitoring device 300 may be configurable by a user to activate or deactivate the environmental monitoring functionality discussed above. For example, the environmental monitoring functionality in the environmental monitoring device 300 may be a license-activated functionality that a user may activate following the purchase of a license from the computing device manufacturer. As such, environmental monitoring devices like the power supply unit 400 discussed above may be configured to operate conventionally (e.g., the power supply unit 400 may be configured to operate like a conventional power supply unit) in situations where the license/environmental monitoring functionality has not been activated.

Thus, systems and methods have been described that provide a computing device component that monitors and records environmental factors regardless of whether that computing device component is connected to a computing device and/or an external power source. For example, the autonomous environmental monitoring device of the present disclosure may include a chassis that is configured to be housed in a computing device. The chassis includes a computing device connector that connects to the computing device, and houses an autonomous environmental monitoring subsystem that is coupled to the computing device connector, at least one environmental monitoring sensor device, a battery system, and a storage device. The autonomous environmental monitoring subsystem provides at least one computing device operating function associated with the operation of the computing device when the computing device connector is connected to the computing device. The autonomous environmental monitoring subsystem also periodically retrieves respective environmental monitoring data generated by the at least one environmental monitoring sensor device when receiving power from the battery system, and stores the respective environmental monitoring data in the storage device. As such, environmental factors that can cause issues with computing devices and that are typically not captured in conventional environmental monitoring systems are recorded and available for failure analysis/root cause analysis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An autonomous environmental monitoring device, comprising:

a chassis that is configured to be housed in a computing device;

a computing device connector that is included on the chassis and that is configured to connect to the computing device when the chassis is housed in the computing device;

at least one environmental monitoring sensor device that is included in the chassis;

a battery system that is included in the chassis;

a storage device that is included in the chassis, and an autonomous environmental monitoring subsystem that is included in the chassis and that is coupled to the computing device connector, the at least one environmental monitoring sensor device, the battery system, and the storage device, wherein the autonomous environmental monitoring subsystem is configured to:

periodically retrieve, when the computing device connector is not connected to the computing device and when receiving power from the battery system, respective first environmental monitoring data generated by the at least one environmental monitoring sensor device;

store, when the computing device connector is not connected to the computing device and when receiving power from the battery system, the respective first environmental monitoring data in the storage device;

provide, when the computing device connector is connected to the computing device, at least one computing device operating function associated with the operation of the computing device;

periodically retrieve, when the computing device connector is connected to the computing device and when receiving power from the battery system, respective second environmental monitoring data generated by the at least one environmental monitoring sensor device; and store, when the computing device connector is connected to the computing device and when receiving power from the battery system, the respective second environmental monitoring data in the storage device.

2. The device of claim 1, further comprising:

a wireless reader subsystem that is coupled to the autonomous environmental monitoring subsystem, wherein the autonomous environmental monitoring subsystem is configured to use the wireless reader subsystem to read a computing device identifier included on the computing device when the computing device connector is connected to the computing device.

3. The device of claim 1, wherein the autonomous environmental monitoring subsystem is configured to:

store, in association with the respective environmental monitoring data periodically retrieved and stored in the storage device, a respective time that the respective environmental monitoring data was retrieved from the at least one environmental monitoring sensor.

4. The device of claim 1, further comprising:

a power system connector that is coupled to the computing device connector and the autonomous environmental monitoring subsystem, and that is configured to connect to a power system, wherein the at least one computing device operating function provided by the autonomous environmental monitoring subsystem includes providing power from the power system to the computing device.

5. The device of claim 4, wherein the autonomous environmental monitoring subsystem is configured to:

determine that the computing device connector is connected to the computing device and that the power system connector is not connected to the power system and, in response, increase a time period between the periodic retrieval of the respective environmental monitoring data to a first time period.

6. The device of claim 5, wherein the autonomous environmental monitoring subsystem is configured to:

determine that the computing device connector is not connected to the computing device and that the power system connector is not connected to the power system and, in response, increase the time period between the periodic retrieval of the respective environment monitoring data to a second time period that is greater than the first time period.

7. An Information Handling System (IHS), comprising:

a processing system; and a memory system that is coupled to the processing system and that includes instructions that, when executed by the processing system, cause the processing system to provide an autonomous environmental monitoring engine that is configured to:

periodically retrieving, when a computing device connector that is coupled to the processing system is not connected to a computing device and when receiving power from a battery system that is coupled to the processing system, respective environmental monitoring data generated by at least one environmental monitoring sensor device that is coupled to the processing system;

store, when the computing device connector is not connected to the computing device and when receiving power from the battery system, the respective environmental monitoring data in a storage device that is coupled to the processing system;

provide, in response to the computing device connector being connected to the computing device, at least one computing device operating function associated with the operation of the computing device;

periodically retrieve, when the computing device connector is connected to the computing device and when receiving power from the battery system, respective environmental monitoring data generated by the at least one environmental monitoring sensor device; and store, when the computing device connector is connected to the computing device and when receiving power from the battery system, the environmental monitoring data in the storage device.

8. The IHS of claim 7, wherein the autonomous environmental monitoring engine is configured to:

use a wireless reader subsystem that is coupled to the processing system to read a computing device identifier included on the computing device when the computing device connector is connected to the computing device.

9. The IHS of claim 7, wherein autonomous environmental monitoring engine is configured to:

store, in association with the respective environmental monitoring data periodically retrieved and stored in the storage device, a respective time that the respective environmental monitoring data was retrieved from the at least one environmental monitoring sensor.

10. The IHS of claim 7, wherein the at least one computing device operating function provided by the autonomous environmental monitoring engine includes providing power from a power system to the computing device via a power system connector that is coupled to the computing device connector and the processing system.

11. The IHS of claim 10, wherein the autonomous environmental monitoring engine is configured to:

determine that the computing device connector is connected to the computing device and that the power system connector is not connected to the power system and, in response, increase a time period between the periodic retrieval of the respective environmental monitoring data to a first time period.

12. The IHS of claim 11, wherein the autonomous environmental monitoring engine is configured to:

determine that the computing device connector is not connected to the computing device and that the power system connector is not connected to the power system and, in response, increase the time period between the periodic retrieval of the respective environmental monitoring data to a second time period that is greater than the first time period.

13. The IHS of claim 7, wherein the autonomous environmental monitoring engine is configured to:

retrieve, as part of the periodic retrieval of the respective environmental monitoring data, first environmental monitoring data generated by the at least one environmental monitoring sensor device;

store, the first environmental monitoring data in the storage device;

enter a sleep mode;

wake, in response to an interrupt from the sleep mode;

retrieve, as part of the periodic retrieval of the respective environmental monitoring data, second environmental monitoring data generated by the at least one environmental monitoring sensor device; and store, the second environmental monitoring data in the storage device.

14. A method for autonomously monitoring environmental factors in a computing device, comprising:

periodically retrieving, by an autonomous environmental monitoring subsystem when a computing device connector that is coupled to the autonomous environmental monitoring subsystem is not connected to a computing device and when receiving power from a battery system, respective environmental monitoring data generated by at least one environmental monitoring sensor device that is coupled to the autonomous environmental monitoring subsystem;

storing, by the autonomous environmental monitoring subsystem when the computing device connector is not connected to the computing device and when receiving power from the battery system the respective environmental monitoring data in a storage device that is coupled to a processing system;

providing, by the autonomous environmental monitoring subsystem in response to the computing device connector being connected to the computing device, at least one computing device operation function associated with the operation of the computing device;

periodically retrieving, by the autonomous environmental monitoring subsystem when the computing device connector is connected to the computing device and when receiving power from the battery system, respective environmental monitoring data generated by at least one environmental monitoring sensor device; and storing, by the autonomous environmental monitoring subsystem when the computing device connector is connected to the computing device and when receiving power from the battery system, the environmental monitoring data in the storage device.

15. The method of claim 14, further comprising:

using, by the autonomous environmental monitoring subsystem, a wireless reader subsystem to read a computing device identifier included on the computing device when the computing device connector is connected to the computing device.

16. The method of claim 14, further comprising:

storing, by the autonomous environmental monitoring subsystem in association with the respective environmental monitoring data periodically retrieved and stored in the storage device, a respective time that the respective environmental monitoring data was retrieved from the at least one environmental monitoring sensor.

17. The method of claim 14, wherein the providing the at least one computing device operating function associated with the operation of the computing device includes:

providing, by the autonomous environmental monitoring subsystem to the computing device, power from a power system that is connected to a power system connector that is coupled to the computing device connector and the autonomous environmental monitoring subsystem.

18. The method of claim 17, further comprising:

determining, by the autonomous environmental monitoring subsystem, that the computing device connector is connected to the computing device and that the power system connector is not connected to the power system and, in response, increasing a time period between the periodic retrieval of the environmental monitoring data to a first time period.

19. The method of claim 18, further comprising:

determining, by the autonomous environmental monitoring subsystem, that the computing device connector is not connected to the computing device and that the power system connector is not connected to the power system and, in response, increasing the time period between the periodic retrieval of the environmental monitoring data to a second time period that is greater than the first time period.

20. The method of claim 14, further comprising:

retrieving, by the autonomous environmental monitoring subsystem as part of the periodic retrieval of respective environmental monitoring data, first environmental monitoring data generated by the at least one environmental monitoring sensor device;

storing, by the autonomous environmental monitoring subsystem, the first environmental monitoring data in the storage device;

entering, by the autonomous environmental monitoring subsystem, a sleep mode;

waking, by the autonomous environmental monitoring subsystem in response to an interrupt, from the sleep mode;

retrieving, by the autonomous environmental monitoring subsystem as part of the periodic retrieval of respective environmental monitoring data, second environmental monitoring data generated by the at least one environmental monitoring sensor device; and storing, by the autonomous environmental monitoring subsystem, the second environmental monitoring data in the storage device.

* * * * *